(12) United States Patent
Maeda et al.

(10) Patent No.: US 7,084,601 B2
(45) Date of Patent: Aug. 1, 2006

(54) PHASE CURRENT DETECTOR

(75) Inventors: Toshiyuki Maeda, Kusatsu (JP);
Tomoisa Taniguchi, Kusatsu (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 10/432,678

(22) PCT Filed: Sep. 25, 2002

(86) PCT No.: PCT/JP02/09901

§ 371 (c)(1),
(2), (4) Date: Jul. 23, 2003

(87) PCT Pub. No.: WO03/032478

PCT Pub. Date: Apr. 17, 2003

(65) Prior Publication Data

US 2004/0056661 A1 Mar. 25, 2004

(30) Foreign Application Priority Data

Sep. 25, 2001 (JP) ............................. 2001-292618
Mar. 20, 2002 (JP) ............................. 2002-079644

(51) Int. Cl.
*H02P 27/00* (2006.01)

(52) U.S. Cl. .................. 318/806; 318/803; 318/811; 363/37; 363/40; 363/98

(58) Field of Classification Search ........ 318/800–828, 318/725, 728, 762, 799; 363/37, 40, 66, 363/98; 323/89, 282; 322/22, 27, 49; 308/64; 361/22, 72
See application file for complete search history.

(56) References Cited

U.S. PATENT DOCUMENTS 4,319,177 A * 3/1982 Kawada et al. ............. 318/798
4,482,854 A * 11/1984 Kawada et al. ............. 318/801
4,574,341 A * 3/1986 Hellegaard et al. ...... 363/56.03
4,599,549 A * 7/1986 Mutoh et al. ............... 318/798
4,607,205 A * 8/1986 Kito et al. .................. 318/778
4,651,266 A * 3/1987 Fujioka et al. ............... 363/39
4,656,571 A * 4/1987 Umezu ........................ 363/37
4,683,409 A * 7/1987 Boillat ....................... 318/696
4,709,292 A * 11/1987 Kuriyama et al. ............ 361/22
4,709,317 A * 11/1987 Iizuka et al. .................. 363/37
4,733,146 A * 3/1988 Hamby ....................... 388/847
4,928,052 A * 5/1990 Fujioka et al. .............. 318/762

(Continued)

FOREIGN PATENT DOCUMENTS

EP 1092981 A2 4/2001

(Continued)

*Primary Examiner*—Paul Ip
(74) *Attorney, Agent, or Firm*—Birch, Stewart, Kolasch & Birch, LLP

(57) ABSTRACT

A first condenser is connected between output terminals of a rectifier circuit which receives an AC power as an input, and a three phase inverter is connected in parallel with respect to the first condenser, and output of the three phase inverter is supplied to a motor, and a second condenser is connected in parallel to the input side of the three phase inverter, and a current detector is connected between the first condenser and the second condenser, and a third condenser is connected in parallel to the first condenser at a position slightly power side with respect to the current detector, and the capacitance of the second condenser is determined as small as possible within the range in which power devices are not destroyed by surge voltage due to switching, therefore, ringing is suppressed, and taking of current is performed rapidly and with high accuracy.

29 Claims, 26 Drawing Sheets

U.S. PATENT DOCUMENTS

| | | | |
|---|---|---|---|
| 5,010,287 A * | 4/1991 | Mukai et al. | 318/801 |
| 5,057,759 A * | 10/1991 | Ueda et al. | 318/616 |
| 5,214,367 A * | 5/1993 | Uesugi | 318/803 |
| 5,367,240 A * | 11/1994 | Schroder-Brumloop et al. | 318/727 |
| 5,811,957 A * | 9/1998 | Bose et al. | 318/802 |
| 5,874,818 A * | 2/1999 | Schuurman | 318/439 |
| 6,008,618 A * | 12/1999 | Bose et al. | 318/811 |
| 6,058,036 A * | 5/2000 | Endo et al. | 363/98 |
| 6,133,651 A * | 10/2000 | Kono et al. | 307/64 |
| 6,316,920 B1 * | 11/2001 | Huggett et al. | 323/207 |
| 6,329,798 B1 * | 12/2001 | Huggett et al. | 323/207 |
| 6,353,545 B1 * | 3/2002 | Ueda | 363/40 |
| 6,456,946 B1 * | 9/2002 | O'Gorman | 702/58 |
| 6,801,009 B1 * | 10/2004 | Makaran et al. | 318/599 |
| 2002/0171405 A1 * | 11/2002 | Watanabe | 323/282 |
| 2003/0090241 A1 * | 5/2003 | Nakatsu et al. | 322/27 |
| 2003/0107348 A1 * | 6/2003 | Inagawa et al. | 322/22 |
| 2003/0107353 A1 * | 6/2003 | Nakamura et al. | 322/89 |
| 2004/0062062 A1 * | 4/2004 | Lee et al. | 363/37 |
| 2004/0095090 A1 * | 5/2004 | Nukushina | 318/800 |
| 2004/0183498 A1 * | 9/2004 | Iwaji et al. | 318/801 |

FOREIGN PATENT DOCUMENTS

| | | | |
|---|---|---|---|
| JP | 2-151776 A | | 6/1990 |
| JP | 07222450 A | * | 8/1995 |
| JP | 9-65662 A | | 3/1997 |
| JP | 10117403 A | * | 5/1998 |
| JP | 10191503 A | * | 7/1998 |
| JP | 11069839 A | * | 3/1999 |
| JP | 2000253512 A | * | 9/2000 |
| JP | 2000-354380 A | | 12/2000 |

* cited by examiner

PHASE CURRENT DETECTOR

This application is the national phase under 35 U.S.C. § 371 of PCT International Application No. PCT/JP02/09901 which has an International filing date of Sep. 25, 2002, which designated the United States of America.

TECHNICAL FIELD

The present invention relates to a phase current detection apparatus for detecting a phase current of a motor based upon a current of a DC (Direct Current) link and a vector pattern to be applied, which apparatus is provided in a motor driving apparatus which supplies outputs from a PWM (Pulse Width Modulation) inverter to a motor so as to drive the motor.

BACKGROUND ART

A conventional apparatus for deforming an output pulse into a measurable output may be known as an apparatus for detecting a phase current of a motor, in a motor driving apparatus for driving the motor using an inverter.

When the above arrangement is employed, disadvantages arise such that error in current measurement due to ringing, waveform deformation due to extension of pulse output time, scaling in driving range, generation of abnormal sound and the like.

Because no analytic methods were proposed at all for ringing especially, disadvantages arise such that reduction of ringing is difficult, and that rapid response cannot be realized, and that measurement accuracy cannot be improved.

Although it may be considered that a pulse current flowing in a DC link can be detected using a shunt resistor, it is difficult that decreasing in affection of noises and that improving measurement accuracy. And, a disadvantage arises in that current detection cannot be realized other than a long pulse, because of a peak voltage due to inductance of a shunt resistor. Therefore, detecting a phase current using a shunt resistor was not made practicable.

SUMMARY OF THE INVENTION

The present invention was made in view of the above problems.

It is an object of the present invention to provide a phase current detection apparatus for suppressing ringing and for realizing taking a current rapidly and with high accuracy.

It is another object of the present invention to provide a phase current detection apparatus for detecting a phase current with high accuracy using a shunt resistor.

A phase current detection apparatus of the present invention is an apparatus which detects a phase current of a motor based upon a current of a DC link and a vector pattern to be applied, and which is provided in a motor driving apparatus which supplies outputs from PWM inverter to the motor so as to drive the motor, the apparatus is characterized in that a capacitance of a bypass condenser which is provided at a power device side position with respect to a current detector on the DC link, is set as small as possible within a range in which no power devices are destroyed by a surge voltage due to the switching.

A phase current detection apparatus of the present invention is an apparatus which detects a phase current of a motor based upon a current of a DC link and a vector pattern to be applied, and which is provided in a motor driving apparatus which supplies outputs from PWM inverter to the motor so as to drive the motor, the apparatus is characterized in that a capacitance of a bypass condenser which is provided at a power device side position with respect to a current detector on the DC link, is set so that a current on the current detector due to resonance phenomenon generated by a combined capacitance of a pair of condensers in power supply side and a wiring inductance between those condensers, becomes equal to or less than a minimum current which can be detected by the current detector.

A phase current detection apparatus of the present invention is an apparatus which detects a phase current of a motor based upon a current of a DC link and a vector pattern to be applied, and which is provided in a motor driving apparatus which supplies outputs from PWM inverter to the motor so as to drive the motor, the apparatus is characterized in that a current is supplied directly to power devices from a bypass condenser in power supply side through a current detector on the DC link.

A phase current detection apparatus of the present invention is an apparatus which detects a phase current of a motor based upon a current of a DC link and a vector pattern to be applied, and which is provided in a motor driving apparatus which supplies outputs from PWM inverter to the motor so as to drive the motor, the apparatus is characterized in that a low-pass filter is provided to a current detector, wherein a cut-off frequency of the low-pass filter is set to a frequency which can sufficiently suppress a component of a ringing frequency within a measurement error, which component is generated based upon wiring from a bypass condenser in power supply side to power devices, wiring from the power devices to the motor, and the motor.

A phase current detection apparatus of the present invention employs as the low-pass filter a low-pass filter including changeover means for changing over cut-off frequencies.

A phase current detection apparatus of the present invention is an apparatus which detects a phase current of a motor based upon a current of a DC link and a vector pattern to be applied, and which is provided in a motor driving apparatus which supplies outputs from PWM inverter to the motor so as to drive the motor, the apparatus is characterized in that a filter is provided to a current detector which filter has a response speed which enables detection of a current at a predetermined minimum voltage vector length, wherein a line length from the inverter to the motor is set by the filter so as to have a frequency which is equal to or more than a frequency enabling suppression of ringing generated based upon wiring from a bypass condenser in power supply side to power devices, wiring from the power devices to the motor, and the motor.

A phase current detection apparatus of the present invention employs as the filter a filter including a low-pass filter which utilizes a through-rate of an amplifier.

A phase current detection apparatus of the present invention employs as the amplifier an amplifier having a through-rate which is equal to or less than a value obtained by multiplying a ringing frequency and a maximum output voltage.

A phase current detection apparatus of the present invention employs as the amplifier included within the current detector an amplifier comprising an operational amplifier and is limited in its bandwidth by a feedback capacitance.

A phase current detection apparatus of the present invention is an apparatus which detects a phase current of a motor based upon a current of a DC link and a vector pattern to be applied, and which is provided in a motor driving apparatus which supplies outputs from PWM inverter to the motor so as to drive the motor, the apparatus is characterized in that a filter comprising a LC serial resonance circuit is provided in parallel to a current detector, wherein its resonance frequency is matched to a frequency of ringing which is generated based upon wiring from a bypass condenser in power supply side to power devices, wiring from the power devices to the motor, and the motor.

A phase current detection apparatus of the present invention is an apparatus which detects a phase current of a motor based upon a current of a DC link and a vector pattern to be applied, and which is provided in a motor driving apparatus which supplies outputs from PWM inverter to the motor so as to drive the motor, the apparatus is characterized in that the apparatus comprises determination means for measuring at least one of a rising delay time, a falling delay time, and a waveform of a current corresponding to a command for the inverter and flowing in at least the DC link, and for determining at least one of a current detection timing, and a minimum voltage vector length based upon the measurement result.

A phase current detection apparatus of the present invention employs as the determination means a determination means which measures at least one of a rising delay time, a falling delay time, and a waveform of a current corresponding to a command for the inverter and flowing in at least the DC link at starting and under a condition in which DC currents are flowed in the motor.

A phase current detection apparatus of the present invention employs as the motor driving apparatus a motor driving apparatus which carries out PWM wave generation using triangle wave comparison method, and employs as the determination means a determination means which carries out measurement of at least one of a rising delay time, a falling delay time, and a waveform of a current corresponding to a command for the inverter and measurement of current for phase current detection, at a rising slope and descending slope of the triangle wave, respectively.

A phase current detection apparatus of the present invention employs as the determination means a determination means which thins down the current measurement for the phase current detection, and carries out measurement of at least one of a rising delay time, a falling delay time, and a waveform of a current corresponding to a command for the inverter.

A phase current detection apparatus of the present invention employs as the motor a motor which drives an enclosed compressor.

A phase current detection apparatus of the present invention is an apparatus which detects a current flowing in a DC link using a shunt resistor, and which is provided in a motor driving apparatus in which outputs from PWM inverter are supplied to the motor so as to drive the motor, the apparatus is characterized in that a first filter is provided for offsetting an error due to inductance component accompanying the shunt resistor.

A phase current detection apparatus of the present invention employs as the first filter a filter which has a pole at a lower frequency than an upper limit of frequency characteristics required for a current detection circuit.

A phase current detection apparatus of the present invention employs as the first filter a filter which involves a pole at a frequency generated by the shunt resistor and inductance component accompanying the shunt resistor.

A phase current detection apparatus of the present invention further comprising a second filter which cancels unnecessary oscillation component of the current flowing in the shunt resistor.

A phase current detection apparatus of the present invention employs as the first or second filter a filter which comprises passive elements and is connected directly to the shunt resistor.

A phase current detection apparatus of the present invention is an apparatus which detects a current flowing in a DC link using a shunt resistor, and which is provided in a motor driving apparatus in which outputs from PWM inverter are supplied to the motor so as to drive the motor, the apparatus is characterized in that noise canceling means is provided which cancels noise due to magnetic flux generated from the shunt resistor and the DC link.

A phase current detection apparatus of the present invention is an apparatus which detects a current flowing in a DC link using a shunt resistor, and which is provided in a motor driving apparatus in which outputs from PWM inverter are supplied to the motor so as to drive the motor, the apparatus is characterized in that circuitry elements are implemented so that the circuitry elements are not affected by noise due to magnetic flux generated from the shunt resistor and the DC link.

A phase current detection apparatus of the present invention implements the circuitry elements in parallel to a plane which is generated by magnetic flux generated from the shunt resistor and the DC link.

A phase current detection apparatus of the present invention is an apparatus which comprises a shunt resistor inserted in a DC link for detecting a motor current, current detection circuit, and a microcomputer receiving a detection current output as an input, and which is provided in a motor driving apparatus in which outputs from PWM inverter are supplied to the motor so as to drive the motor, the apparatus is characterized in that signal ground of the current detection, circuit and ground of the micro-computer are connected to one another at one side of the shunt resistor.

A phase current detection apparatus of the present invention is an apparatus which comprises a shunt resistor inserted in a DC link for detecting a motor current, current detection circuit, and a micro-computer receiving a detection current output as an input, and which is provided in a motor driving apparatus in which outputs from PWM inverter are supplied to the motor so as to drive the motor, the apparatus is characterized in that common mode choke coils are inserted to ground of the current detection output and the micro-computer.

When the phase current detection apparatus of the present invention is employed, and when the apparatus detects a phase current of a motor based upon a current of a DC link and a vector pattern to be applied, in a motor driving apparatus which supplies outputs from PWM inverter to the motor so as to drive the motor, the apparatus sets the capacitance of the bypass condenser which is provided at a power device side position with respect to the current detector on the DC link, as small as possible within a range in which no power devices are destroyed by a surge voltage due to the switching. Therefore, current detection accuracy is improved by preventing ringing of current due to resonance from flowing in the current detector.

When the phase current detection apparatus of the present invention is employed, and when the apparatus detects a phase current of a motor based upon a current of a DC link and a vector pattern to be applied, in a motor driving apparatus which supplies outputs from PWM inverter to the motor so as to drive the motor, the apparatus sets the capacitance of the bypass condenser which is provided at a power device side position with respect to the current detector on the DC link, so that a current on the current detector due to resonance phenomenon generated by a combined capacitance of a pair of condensers in power supply side and a wiring inductance between those condensers, becomes equal to or less than a minimum current which can be detected by the current detector. Therefore, measurement error is greatly decreased and current measurement accuracy is improved.

When the phase current detection apparatus of the present invention is employed, and when the apparatus detects a phase current of a motor based upon a current of a DC link and a vector pattern to be applied, in a motor driving apparatus which supplies outputs from PWM inverter to the motor so as to drive the motor, the apparatus supplies the current directly to power devices from the bypass condenser in power supply side through the current detector on the DC link. Therefore, affection of resonance current is suppressed to nearly zero and current measurement accuracy is improved.

When the phase current detection apparatus of the present invention is employed, and when the apparatus detects a phase current of a motor based upon a current of a DC link and a vector pattern to be applied, in a motor driving apparatus which supplies outputs from PWM inverter to the motor so as to drive the motor, the apparatus provides the low-pass filter to the current detector, wherein a cut-off frequency of the low-pass filter is set to a frequency which can sufficiently suppress a component of a ringing frequency within a measurement error, which component is generated based upon wiring from a bypass condenser in power supply side to power devices, wiring from the power devices to the motor, and the motor. Therefore, the component of the ringing frequency is sufficiently suppressed, and the current detection accuracy is improved.

When the phase current detection apparatus of the present invention is employed, the apparatus employs as the low-pass filter a low-pass filter including changeover means for changing over cut-off frequencies. Therefore, varying in wiring length and the like can be flexibly dealt with, and the disclosed operation and effect can be realized.

When the phase current detection apparatus of the present invention is employed, and when the apparatus detects a phase current of a motor based upon a current of a DC link and a vector pattern to be applied, in a motor driving apparatus which supplies outputs from PWM inverter to the motor so as to drive the motor, the apparatus provides the filter to the current detector which filter has a response speed which enables detection of a current at a predetermined minimum voltage vector length, wherein a line length from the inverter to the motor is set by the filter so as to have a frequency which is equal to or more than a frequency enabling suppression of ringing generated based upon wiring from the bypass condenser in power supply side to power devices, wiring from the power devices to the motor, and the motor. Therefore, the component of the ringing frequency is sufficiently suppressed, and the current measurement accuracy is improved.

When the phase current detection apparatus of the present invention is employed, the apparatus employs as the filter a filter including a low-pass filter which utilizes a through-rate of an amplifier. Therefore, the disclosed operation and effect can be realized.

When the phase current detection apparatus of the present invention is employed, the apparatus employs as the amplifier an amplifier having a through-rate which is equal to or less than a value obtained by multiplying a ringing frequency and a maximum output voltage. Therefore, the disclosed operation and effect can be realized.

When the phase current detection apparatus of the present invention is employed, the apparatus employs as the amplifier included within the current detector an amplifier comprising an operational amplifier and is limited in its bandwidth by a feedback capacitance. Therefore, not only overshoot but also undershoot is greatly reduced, and the disclosed operation and effect can be realized.

When the phase current detection apparatus of the present invention is employed, and when the apparatus detects a phase current of a motor based upon a current of a DC link and a vector pattern to be applied, in a motor driving apparatus which supplies outputs from PWM inverter to the motor so as to drive the motor, the apparatus provides the filter comprising a LC serial resonance circuit in parallel to a current detector, wherein its resonance frequency is matched to a frequency of ringing which is generated based upon wiring from a bypass condenser in power supply side to power devices, wiring from the power devices to the motor, and the motor. Therefore, affection of ringing is reduced, and current detection accuracy is improved.

When the phase current detection apparatus of the present invention is employed, and when the apparatus detects a phase current of a motor based upon a current of a DC link and a vector pattern to be applied, in a motor driving apparatus which supplies outputs from PWM inverter to the motor so as to drive the motor, the apparatus comprises determination means for measuring at least one of a rising delay time, a falling delay time, and a waveform of a current corresponding to a command for the inverter and flowing in at least the DC link, and for determining at least one of a current detection timing, and a minimum voltage vector length based upon the measurement result. Therefore, affection of delay and the like due to devices is reduced, and current detection accuracy is improved.

When the phase current detection apparatus of the present invention is employed, the apparatus employs as the determination means a determination means which measures at least one of a rising delay time, a falling delay time, and a waveform of a current corresponding to a command for the inverter and flowing in at least the DC link at starting and under a condition in which DC currents are flowed in the motor. Therefore, delay time is measured under a condition that current value does not vary and that PWM width does not vary, so that current detection accuracy is improved.

When the phase current detection apparatus of the present invention is employed, the apparatus employs as the motor driving apparatus a motor driving apparatus which carries out PWM wave generation using triangle wave comparison method, and employs as the determination means a determination means which carries out measurement of at least one of a rising delay time, a falling delay time, and a waveform of a current corresponding to a command for the inverter and measurement of current for phase current detection, at a rising slope and descending slope of the triangle wave, respectively. Therefore, delay time is always measured while current is detected, and current detection accuracy is improved.

When the phase current detection apparatus of the present invention is employed, the apparatus employs as the determination means a determination means which thins down the current measurement for the phase current detection, and carries out measurement of at least one of a rising delay time, a falling delay time, and a waveform of a current corresponding to a command for the inverter. Therefore, measurement of delay time is carried out by stopping phase current detection properly, and current detection accuracy is improved, even when a system not having symmetry is employed.

When the phase current detection apparatus of the present invention is employed, the apparatus employs as the motor a motor which drives an enclosed compressor. Therefore, the disclosed operation and effect are realized even when an enclosed compressor is driven.

When the phase current detection apparatus of the present invention is employed, the apparatus detects a current flowing in a DC link using a shunt resistor, in a motor driving apparatus in which outputs from PWM inverter are supplied to the motor so as to drive the motor, the apparatus offsets an error due to inductance component accompanying th shunt resistor using the first filter. Therefore, accuracy of phase current detection is improved.

When the phase current detection apparatus of the present invention is employed, the apparatus employs as the first filter a filter which has a pole at a lower frequency than an upper limit of frequency characteristics required for a current detection circuit. Therefore, flat characteristics for a wide range is realized, consequently accuracy of phase current detection is improved.

When the phase current detection apparatus of the present invention is employed, the apparatus employs as the first filter a filter which involves a pole at a frequency made from the shunt resistor and inductance component accompanying the shunt resistor. Therefore, flat characteristics for a wide range is realized, consequently accuracy of phase current detection is improved.

When the phase current detection apparatus of the present invention is employed, the apparatus further comprises a second filter which cancels an unnecessary oscillation component of the current flowing in the shunt resistor. Therefore, the effect of unnecessary oscillation is removed, and the disclosed operation and effect are realized.

When the phase current detection apparatus of the present invention is employed, the apparatus employs as the first or second filter a filter which comprises passive elements and is connected directly to the shunt resistor. Therefore, the disclosed operation and effect are realized by the arrangement which hardly generates error due to asymmetry and is cheap.

When the phase current detection apparatus of the present invention is employed, and when the apparatus detects a current flowing in a DC link using a shunt resistor, in a motor driving apparatus in which outputs from PWM inverter are supplied to the motor so as to drive the motor, the apparatus cancels noise due to magnetic flux generated from the shunt resistor and the DC link using the noise canceling means. Therefore, accuracy of phase current detection is improved.

When the phase current detection apparatus of the present invention is employed, and when the apparatus detects a current flowing in a DC link using a shunt resistor, in a motor driving apparatus in which outputs from PWM inverter are supplied to the motor so as to drive the motor, the circuitry elements are not affected by noise due to magnetic flux generated from the shunt resistor and the DC link by the implementation of the circuitry elements. Therefore, accuracy of phase current detection is improved.

When the phase current detection apparatus of the present invention is employed, the apparatus implements the circuitry elements in parallel to a plane which is generated by magnetic flux generated from the shunt resistor and the DC link. Therefore, accuracy of phase current detection is improved.

When the phase current detection apparatus of the present invention is employed, and when the apparatus comprises a shunt resistor inserted in a DC link for detecting a motor current, current detection circuit, and a micro-computer receiving a detection current output as an input, and which is provided in a motor driving apparatus in which outputs from PWM inverter are supplied to the motor so as to drive the motor, the apparatus connects signal ground of the current detection circuit and ground of the micro-computer to one another at one side of the shunt resistor. Therefore, potential of signal ground is prevented from varying despite current flowing in the micro-computer ground, and accuracy of-phase current detection is improved.

When the phase current detection apparatus of the present invention is employed, and when the apparatus which comprises a shunt resistor inserted in a DC link for detecting a motor current, current detection circuit, and a micro-computer receiving a detection current output as an input, and which is provided in a motor driving apparatus in which outputs from PWM inverter are supplied to the motor so as to drive the motor, the apparatus inserts the common mode choke coils to ground of the current detection output and the micro-computer. Therefore, transmission of common mode signal is prevented, noise current flowing in the micro-computer ground is reduced, and accuracy of phase current detection is improved.

DETAILED DESCRIPTION OF THE PREFERRED EMBODIMENTS

Hereinafter, referring to the accompanying drawings, we explain a phase current detection apparatus of embodiments according to the present invention in detail.

Figure 1:
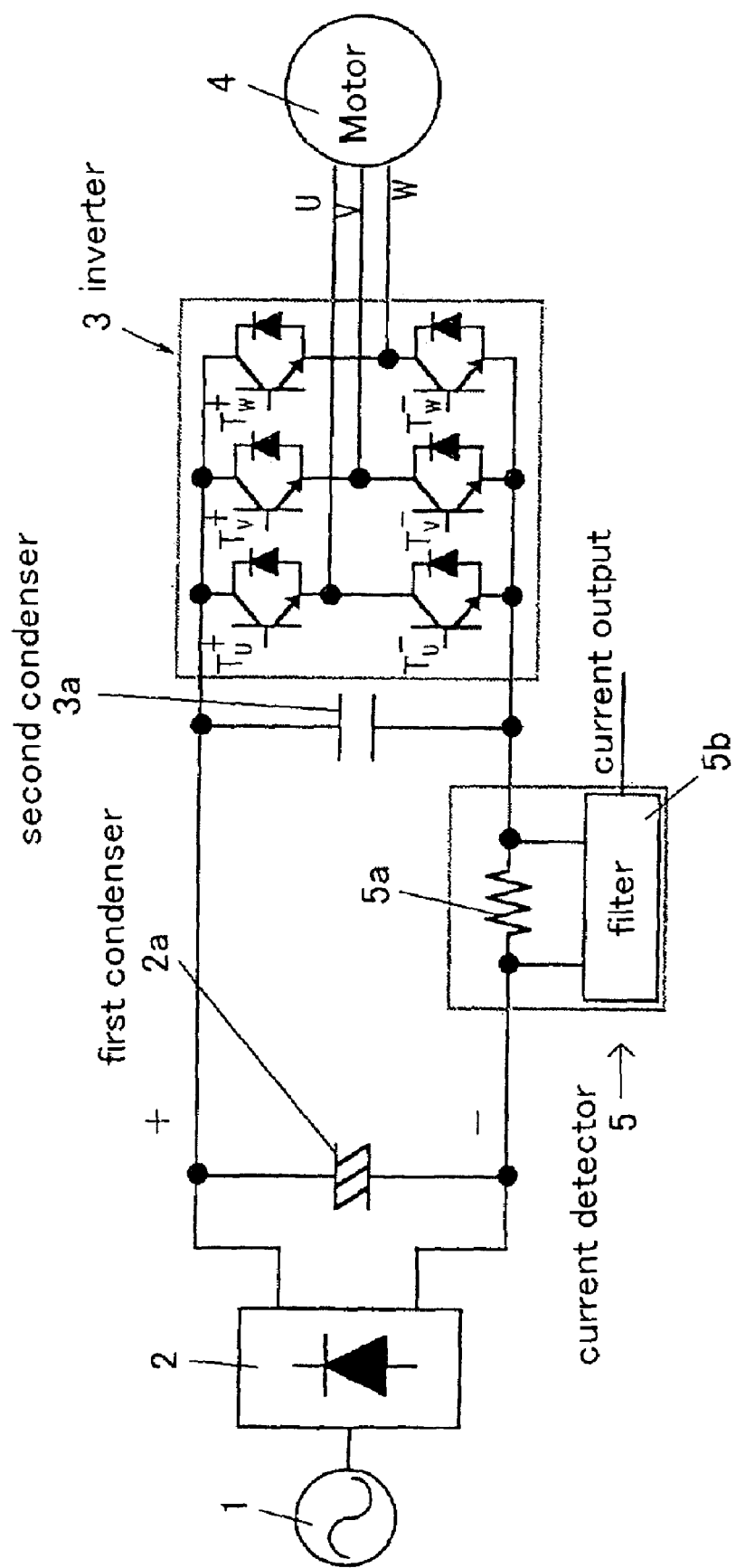
FIG. 1 is a diagram illustrating an arrangement of a motor driving apparatus using an inverter.

FIG. 1 is a diagram illustrating an arrangement of a motor driving apparatus using an inverter. FIG. 1 depicts relationships between an output voltage vector of the inverter (power devices) and switching condition of switching elements.

In FIG. 1, $T_u$, $T_v$, $T_w$ represent switching elements of upper arms of u-phase, v-phase, and w-phase, respectively. $T_u^-$, $T_v^-$, $T_w^-$ represent switching elements of lower arms of u-phase, v-phase, and w-phase, respectively. In FIG. 1, ON represents a condition that a switching element of an upper arm is turned ON and a switching element of a lower arm is turned OFF. OFF represents a condition that a switching element of an upper arm is turned OFF and a switching element of a lower arm is turned ON.

In the above motor driving apparatus, a first condenser 2a is connected between output terminals of a rectifier circuit 2 which receives an AC power 1 as an input. A three phase inverter 3 is connected in parallel with respect to the first condenser 2a. Output of the three phase inverter 3 is supplied to a motor 4. A second condenser 3a is connected in parallel to the input side of the three phase inverter 3. A current detector 5 is connected between the first condenser 2a and the second condenser 3a.

This current detector 5 has a shunt resistor 5a and a current output section 5b. The shunt resistor 5a is inserted in a wiring between the first condenser 2a and the second condenser 3a. The current output section 5b receives the voltage between terminals of the shunt resistor 5a as an input, and outputs it as a detected current.

Therefore, when a voltage vector is V0 or V7, all terminals of the motor 4 are connected to − line or + line of the power so that voltage for increasing or decreasing current (hereinafter, referred to as voltage, simply) is not applied to the motor 4. When a voltage vector is V1, for example, the terminal of w-phase of the motor 4 is connected to +line of the power while the terminals of other phases of the motor 4 are connected to −line of the power so that voltage is applied in a direction for increasing w-phase current (u-phase and v-phase are in negative direction, respectively).

When PWM (pulse width modulation) is employed, magnitude of a voltage is determined based upon a ratio of a time for outputting a voltage vector within a carrier. Therefore, when each voltage of each phase is nearly the same to one another, a voltage vector for a very short time period corresponding to a voltage difference between phases (hereinafter, it is referred to as "voltage vector is short"). When an output voltage is low, a particularly short voltage vector is output so that the voltage vector V0, V7 occupies most time period within a carrier, the voltage vector V0, V7 applying no voltage to the motor 4.

Figure 2:
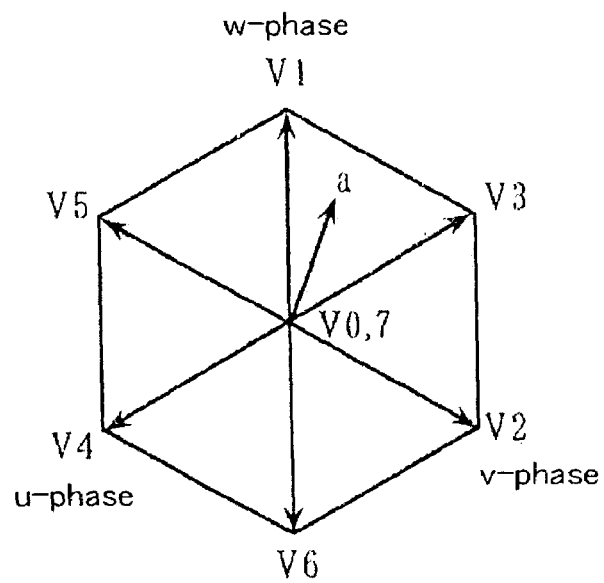
FIG. 2 is a diagram representing application voltage for a motor in two dimensions.

FIG. 2 represents a voltage applied to the motor 4, the voltage being represented in two dimensional manner. A case is defined to be u-phase direction that a positive voltage is applied to u-phase while negative voltages are applied to v-phase and w-phase. V-phase direction and w-phase direction are defined similarly. And, magnitude of a voltage is represented by a length of a vector.

In this case, the voltage vectors VO~V7 are disposed as are seen in FIG. 2. When a vector located between the voltage vector VI and the voltage vector V3 is output, for example, a voltage vector is changed suitably and is output in the order of VO, VI, V3, V7, for example, in conventional spatial vector method.

When the output voltage is determined to be small (to shorten the length of the vector), the outputting time of the voltage vectors V0, V7. And, it is sufficient for maintaining the direction of the vector that a ratio between outputting times of the voltage vectors V1 and V3 is kept to be constant.

Figure 3:
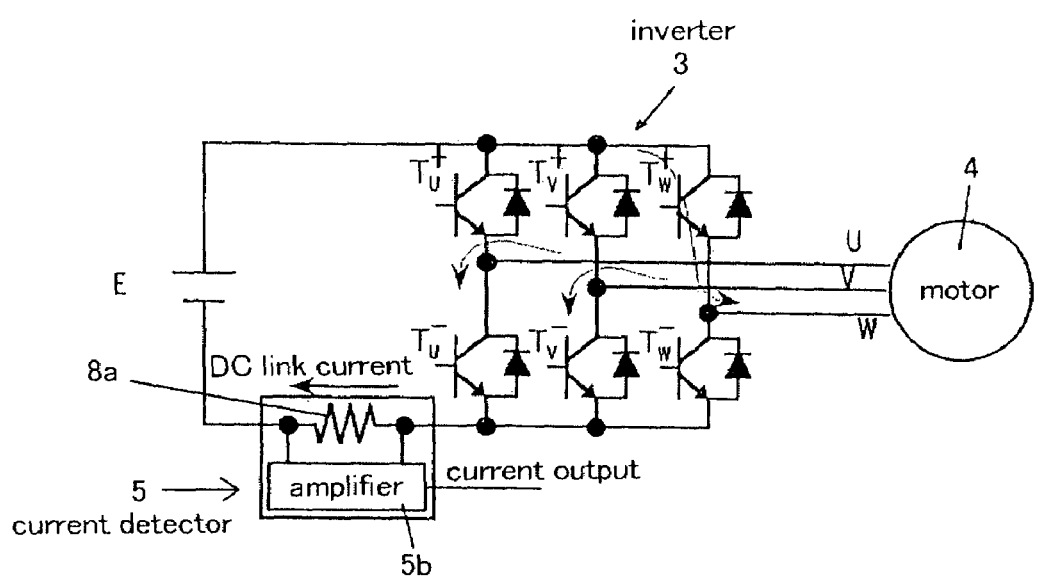
FIG. 3 is a diagram useful in understanding current flow when V1 vector is output.
Figure 4:
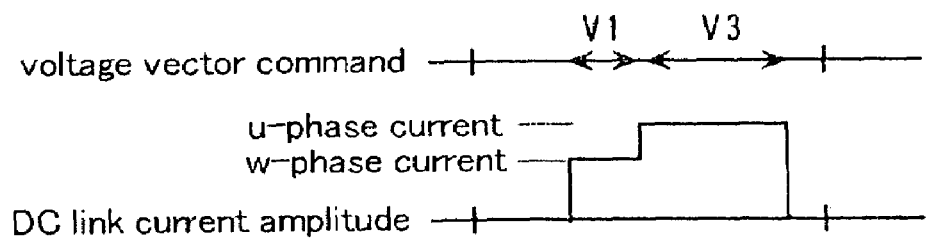
FIG. 4 is a diagram useful in understanding current flowing in DC link.

A phase current can be detected from the DC link by using characteristics that when the vector a is output, for example, the w-phase current flows though the DC link (refer to an arrow in FIG. 3) during the period in which the voltage vector VI is output, and a current reverse in positive-negative with respect to the u-phase current during the period in which the voltage vector V3 is output (refer to FIG. 4 and "Method for Detecting Three Phase Output Current of PWM Inverter at Its DC Side", by Tanizawa et al., IEa-94-17, herein incorporated by reference (hereinafter, refer to as cited reference)).

Figure 5:
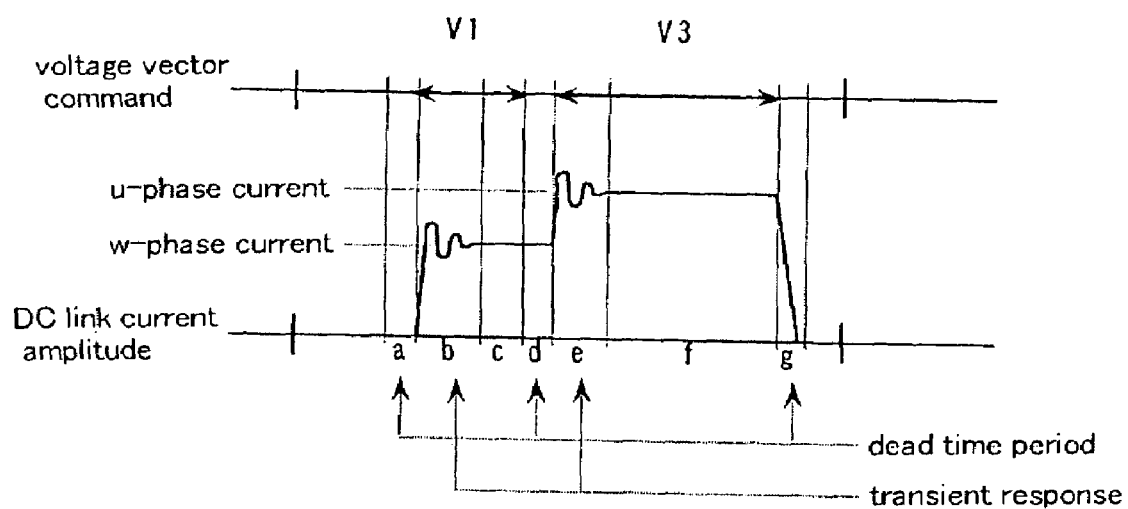
FIG. 5 is a diagram illustrating real measurement example of current flowing in DC link.

By taking an actual current detection into consideration, there is a period when measurement cannot be performed, within transient state which corresponds to a state from variation in current value to stabilization of the circuit (refer to FIG. 5). Therefore, there is a need to shorten the transient state as short as possible and to measure a current without unnecessary pulse restriction.

Figure 6:
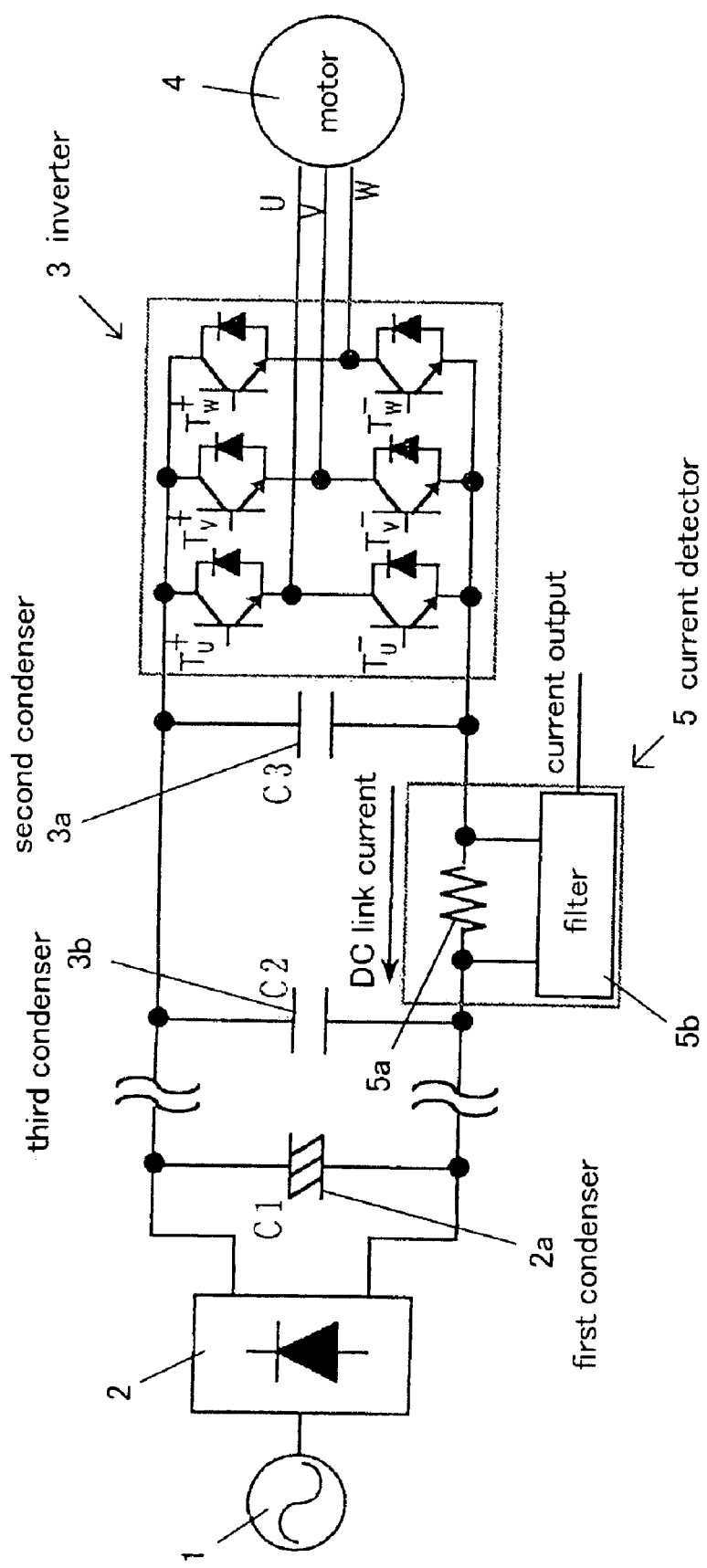
FIG. 6 is a diagram illustrating an arrangement of a motor driving apparatus in which a phase current detection apparatus of an embodiment of the present invention is applied.

FIG. 6 is a diagram illustrating an arrangement of a motor driving apparatus in which a phase current detection apparatus of an embodiment according to the present invention is applied.

This motor driving apparatus is different from the motor driving apparatus of FIG. 1 in that a third condenser 3b is further provided which is connected in parallel to the first condenser 2a at a little upstream side with respect to the current detector 5, and that the capacitance of the second condenser 3a is determined to be as small as possible within a range in which power devices are not destroyed by a surge voltage due to switching.

Operation and effect of the motor driving apparatus having the above arrangement are as follows.

The power input from the AC power 1 is rectified by the rectifier circuit 2, then the rectified output is applied smoothing by the first condenser 2a so as to be supplied to the inverter 3, than the output from the inverter 3 is supplied to the motor 4 along the voltage vector.

The second condenser 3a is provided nearby the power devices of the inverter 3 for protecting the power devices, and the inductance component from the second condenser 3a to the power devices is determined as small as possible.

Because the first condenser 2a is a condenser having great capacitance, length of the wiring between the first condenser 2a and the third condenser 3b is long.

Figure 7:
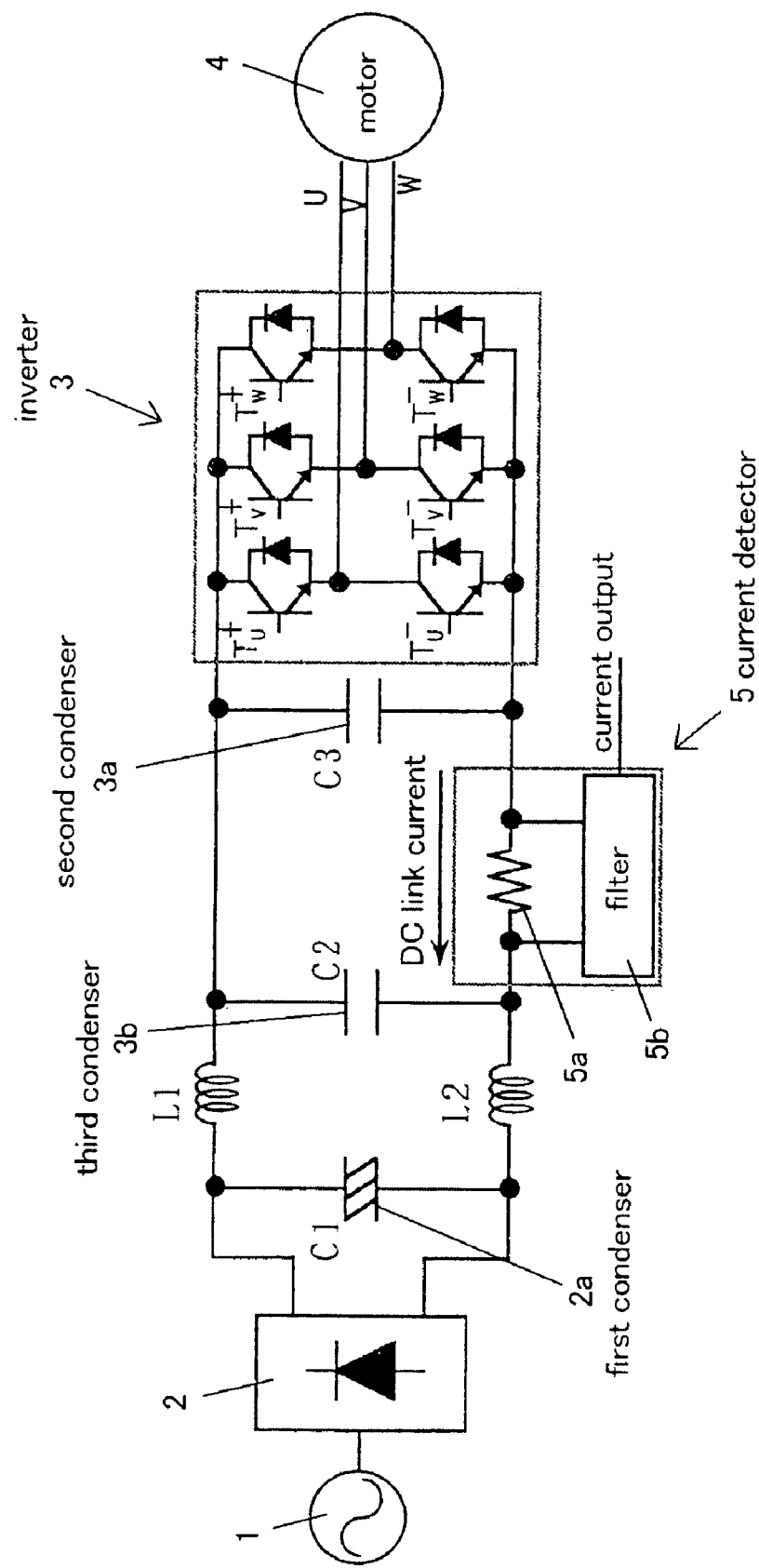
FIG. 7 is a diagram which is revised FIG. 6 conceptually by taking notice of resonance.

FIG. 7 is a diagram which is a revised diagram of FIG. 6 by taking notice of resonance. Inductance 2b and 2c due to wiring are connected between the first condenser 2a and the third condenser 3b.

It is understood from FIG. 7 that resonance is generated between the inductances 2b and 2c and combined capacitance of the second condenser 3a and the third condenser 3b, the inductances 2b and 2c being due to wiring are connected between the first condenser 2a and the third condenser 3b, and that a ringing current having a long interval and a great magnitude flows into the current detector 5 when the capacitance of the second condenser 3a and the third condenser 3b are determined to be nearly the same (for example, about 1 uF) to one another.

In this embodiment, however, the capacitance of the second condenser 3a is determined to be as small as possible within a range in which the power devices are not destroyed by a surge voltage due to switching, so that most of the ringing of current due to resonance can be made not to flow in the current detector 5 thereby current detection accuracy is improved.

Further, the resonance current is determined based upon the inductances 2b and 2c due to wiring between the first condenser 2a and the third condenser 3b, motor phase currents, the second condenser 3a and the third condenser 3c, and the resonance current flowing in the current detector 5 is determined based upon the capacitance ratio of the second condenser 3a and the third condenser 3b (only the resonance current flowing in the second condenser 3a flows in the current detector 5, because the resonance current is distributed to the second condenser 3a and the third condenser 3b.

When the inductances 2b and 2c due to wiring between the first condenser 2a and the third condenser 3b, motor phase currents, the second condenser 3a and the third condenser 3b are determined, an error due to the resonance current flowing in the current detector 5 can easily be calculated. However, it is difficult to design accurately the inductance 2b~ and 2c due to wiring between the first condenser 2a and the third condenser 3b. However, measurement error can be eliminated by actually measuring an error due to resonance current when the current is maximum (when the current step is maximum step under the situation that the power devices are turned ON), and by determining the capacitance ratio of the second condenser 3a and the third condenser 3b so as to determine the error due to the resonance current to be equal to or less than the determined minimum value of detected current.

As described above, due to the effect of the second condenser 3a, the resonance current based upon the inductance due to the wiring, the second condenser 3a and the third condenser 3b flows in the current detector 5 so as to generate the error. On the other hand, although the second condenser 3a prevents the power devices from being destroyed by the peak voltage following the switching, the third condenser 3b is made to bear the function of the second condenser 3a so as to determine the capacitance of the second condenser 3a to be 0 by connecting the third condenser 3b, the current detector 5 and the power devices with extremely short wiring to one another, because the voltage difference between the input and output of the current detector 5 is extremely small.

Consequently, the resonance current is prevented from flowing in the current detector 5 so that effect due to the resonance current is virtually totally suppressed.

Figure 8:
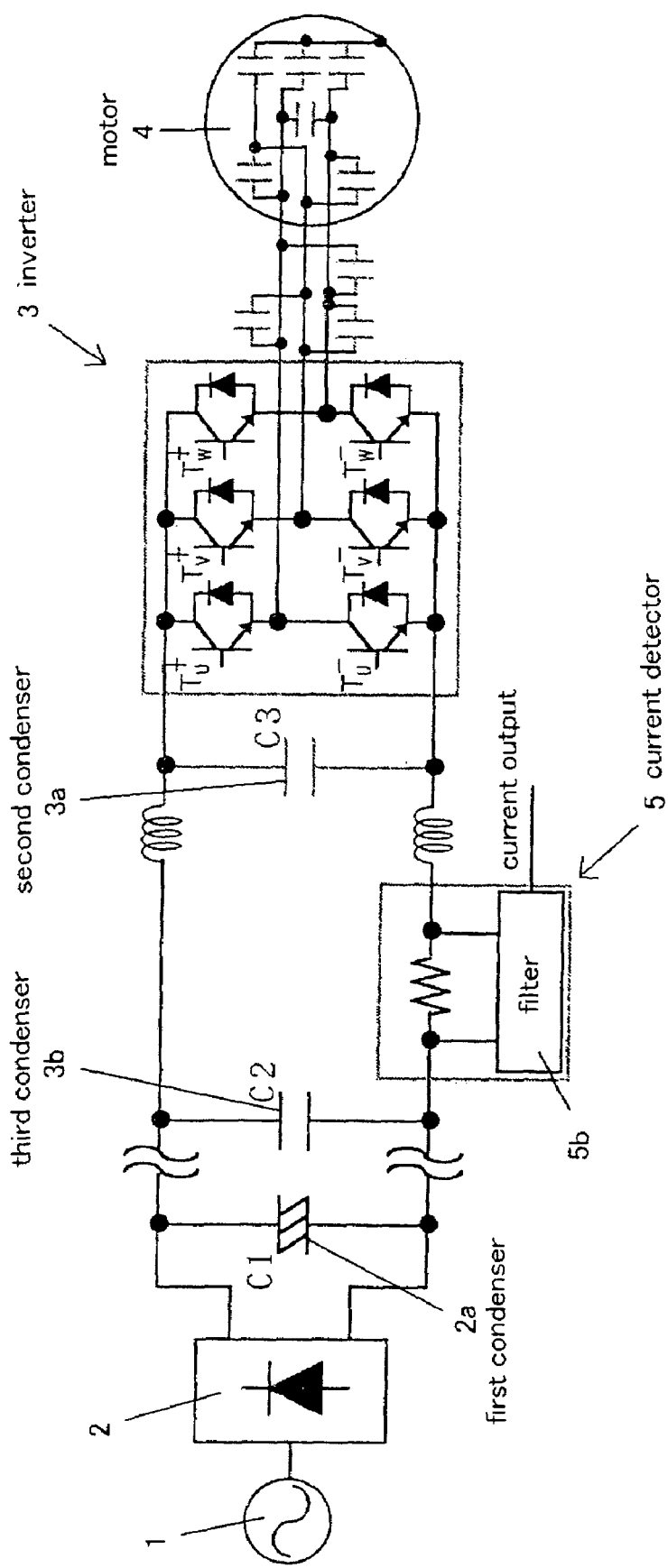
FIG. 8 is a diagram illustrating conceptual circuit arrangement of a motor driving apparatus in view of current detection.

FIG. 8 is a diagram illustrating a conceptual circuit arrangement of a motor driving apparatus which is seen from current detection.

Figure 9:
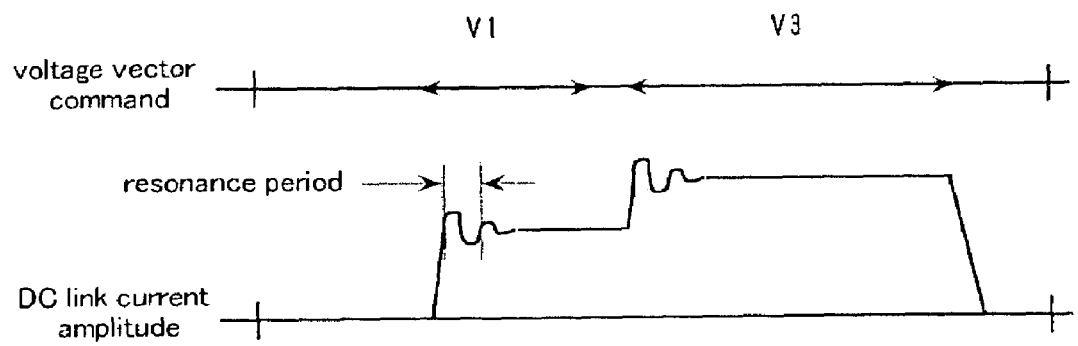
FIG. 9 is a diagram illustrating a measurement example of a current flowing through a DC link.

Inductance component is superior between the third condenser 36 and the power devices while capacitance component is superior between the power devices and the motor 4. Regardless the motor 4 comprises winding so that the motor 4 has great inductance, capacitance component is superior by taking the ringing frequency component into consideration. The motor 4 also has stray capacitance to the stator. Due to this situation, resonance is generated based upon the inductance and the capacitance. The frequency of this resonance is faster than the resonance phenomenon generated by the inductance 2b and 2c due to wiring between the first condenser 2a and the third condenser 3b and the combined capacitance of the second condenser 3a and the third condenser 3b. Therefore, the current flowing in the current detector 5 becomes oscillating current for a while from the voltage vector output, as is illustrated in FIG. 9.

Figure 10:
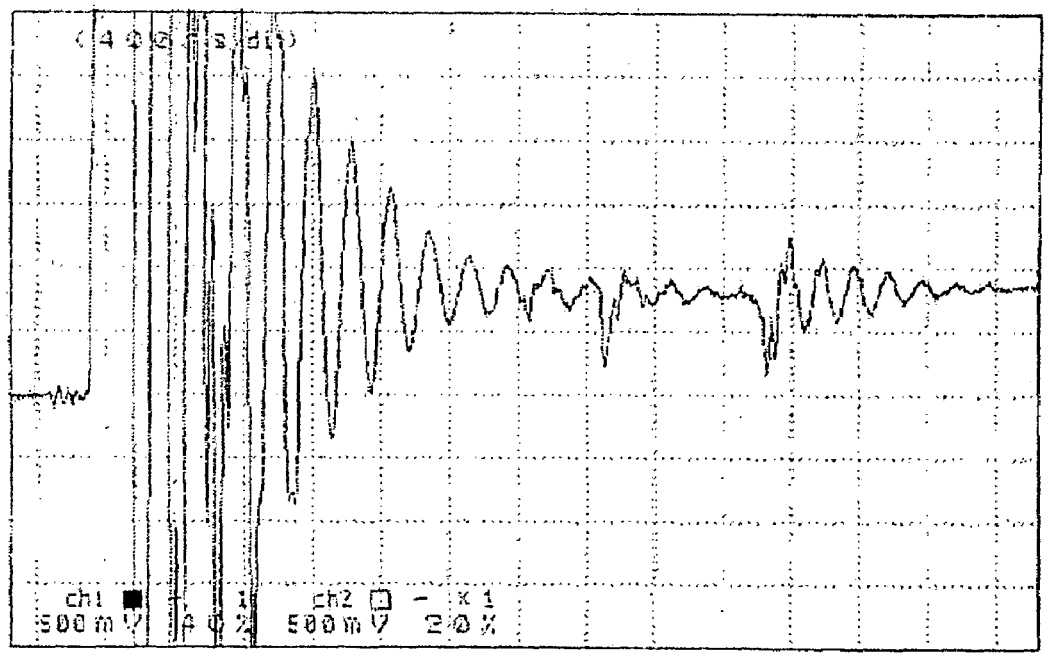
FIG. 10 is a diagram illustrating a measurement example of a current flowing through a DC link when a length of wiring is 2 meters.

An actual measurement waveform under a condition that the wiring length is determined to be two meters is illustrated in FIG. 10.

In this observed waveform, the resonance frequency of about 200 ns under the wiring length of two meters is observed. This frequency is faster by about 10 times than the resonance phenomenon generated by the inductance 2b and 2c due to wiring between the first condenser 2a and the third condenser 3b and the combined capacitance of the second condenser 3a and the third condenser 3b. Therefore, it is the greatest factor for the error in the motor driving apparatus which is applied the measure of the above embodiment.

Figure 11:
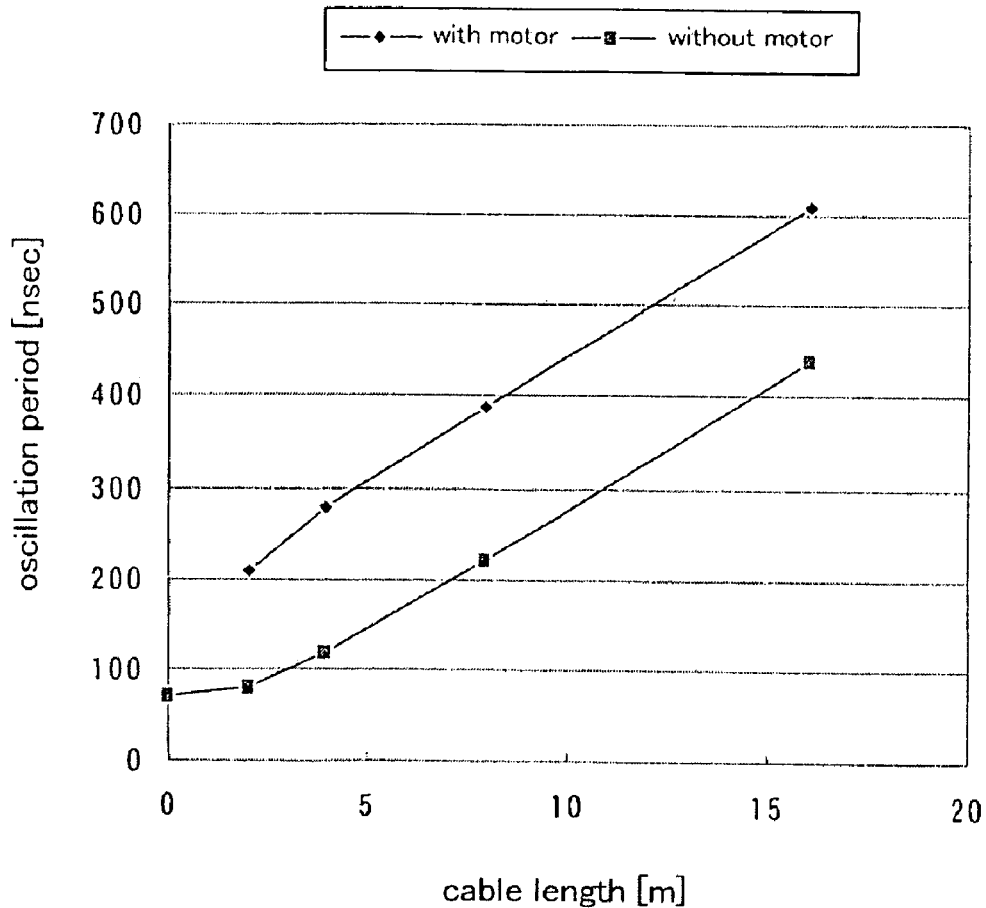
FIG. 11 is a diagram illustrating a relationship between a cable length and a ringing oscillation interval.

Relationships between the wiring from the power devices to the motor 4 and the resonance cycles due to the existence or not of the motor 4, observed from those waveforms, are illustrated in FIG. 11.

It is understood that the oscillation cycle is increased by a constant value by the addition of the motor 4, and that the oscillation cycle is increased linearly following the increase in wiring length (cable length). In FIG. 11, it is understood that the cycle change of three times is realized for the cable length of from two meters to 16 meters, and that the filter formed in the current detector 5 is needed to have frequency characteristics matching to the frequency when the cutoff frequency is determined to be a low frequency for the cable length of 16 meters, by taking the required vector length for the current detection becoming longer into consideration.

As is understood from the foregoing, current measurement accuracy is greatly improved by providing a filter in the motor driving apparatus applied the measure of the above embodiment, the filter sufficiently suppressing ringing frequency component within the range of measurement error which ringing frequency component is generated based upon the wiring from the third condenser 3b to the power devices and the wiring from the power devices to the motor 4 and the motor 4.

It is preferable that a filter having a changeover means for changing over the cutoff frequency is employed as the filter so that it is possible that flexible coping with the change in wiring length and the like is realized by changing over the frequency characteristics.

Then, this filter is further described.

Figure 12:
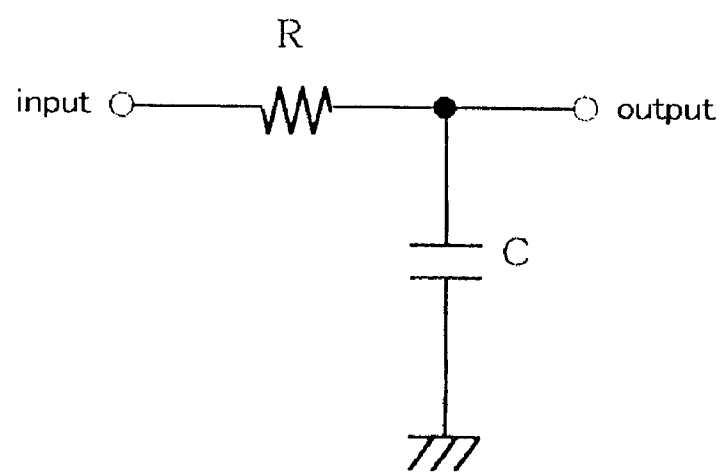
FIG. 12 is a diagram illustrating an arrangement of an RC primary filter.

Description is made by taking the RC primary filter circuit illustrated in FIG. 12 as an example, for simplifying the description.

Figure 13:
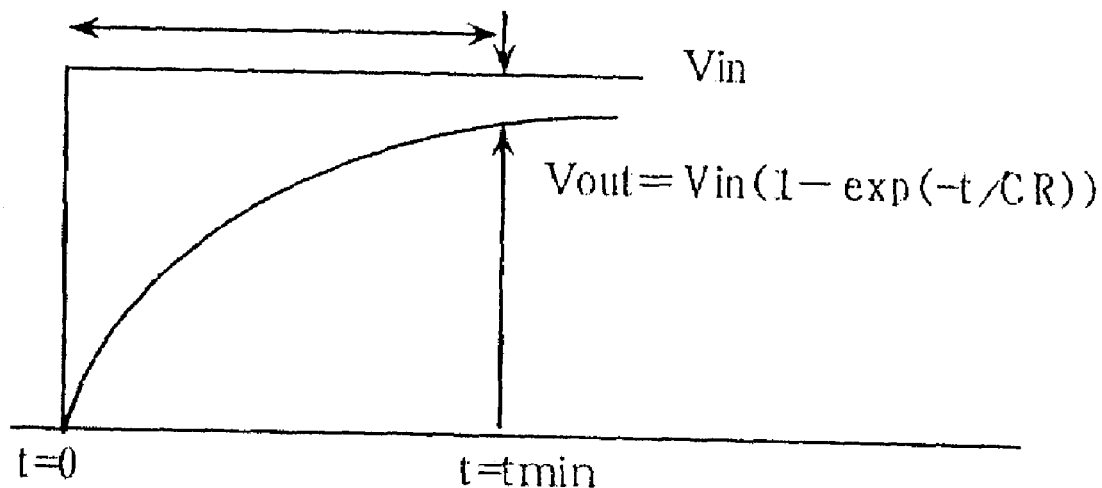
FIG. 13 is a diagram illustrating response characteristics of an RC primary filter.
Figure 14:
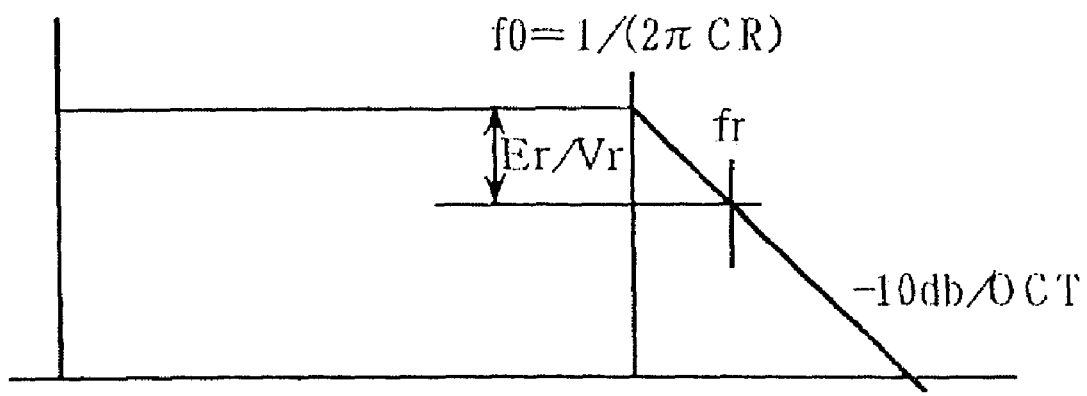
FIG. 14 is a diagram illustrating frequency characteristics of an RC primary filter.

The step response characteristics of this RC primary filter are characteristics illustrated in FIG. 13, while the frequency characteristics of the RC primary filter are characteristics illustrated in FIG. 14. Provided that the current is detected at the final timing of the vector when the minimum vector length is output, the value of CR is determined using the relationship of $1-Es=\{1-\exp(-tmin/CR)\}$ (wherein tmin represents a time of detection timing) from the allowable error Es due to the speed of response at the detection timing. The cutoff frequency f0 of the filter is calculated from the value. The ringing amount Es/Vr to be suppressed is calculated from the amplitude Vr of the ringing at tmin and the allowable error Es due to the ringing. And, the ringing frequency fr is obtained from the ringing amount Es/Vr.

Therefore, current detection accuracy can be improved by determining the wiring length from the inverter 3 to the motor 4 so as to make the resonance frequency to be equal to or greater than the ringing frequency fr.

Figure 15:
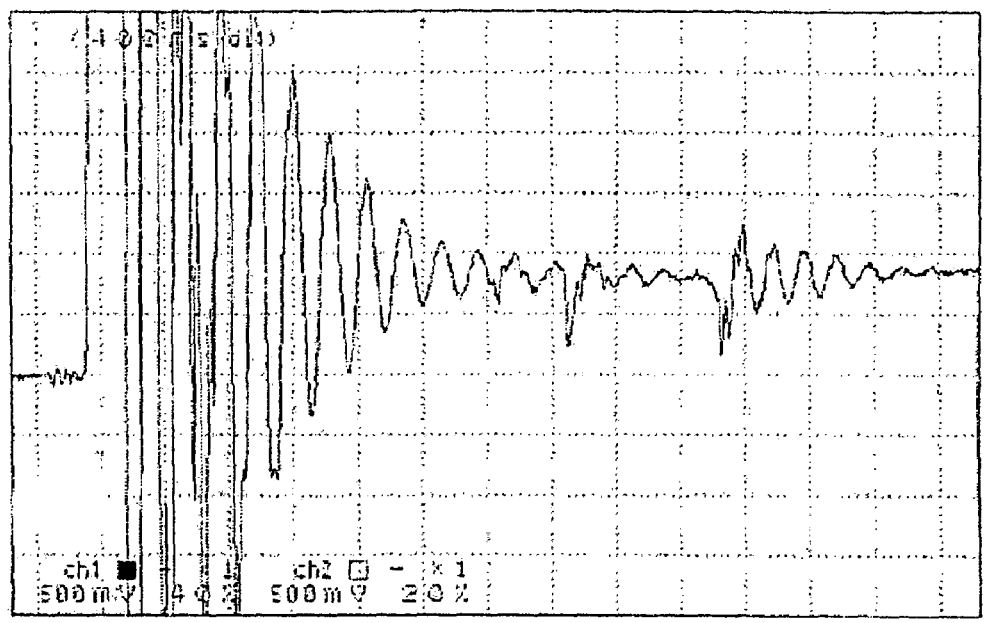
FIG. 15 is a diagram illustrating a current waveform when a filter is omitted.
Figure 16:
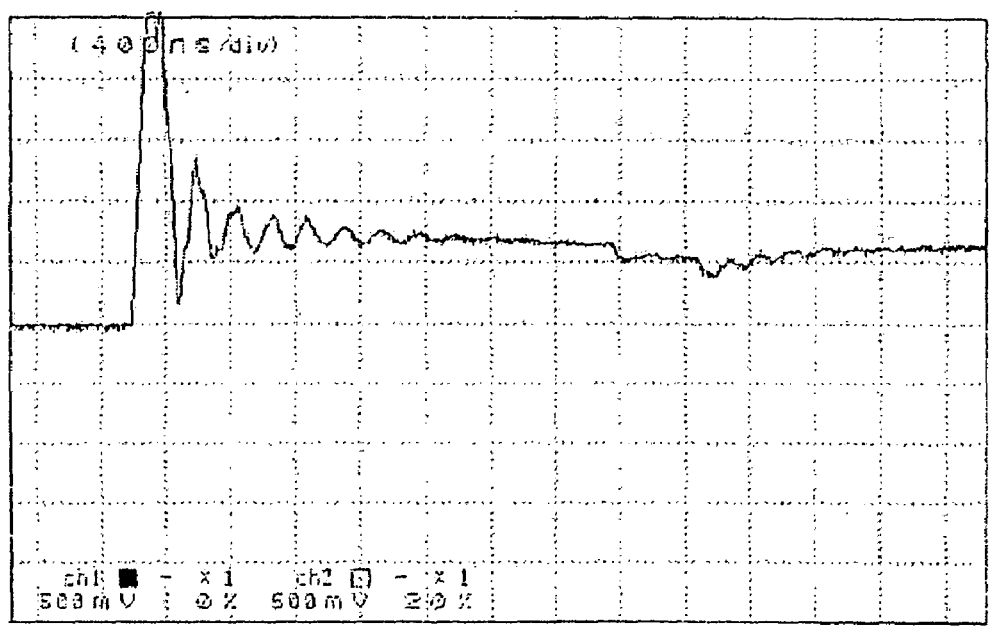
FIG. 16 is a diagram illustrating a current waveform in a case that a slow amplifier is employed.

The actual measurement waveform in a case that no filtering is carried out, is illustrated in FIG. 15, while the actual measurement waveform in a case that slower amplifier (25 V/μs) is employed, is illustrated in FIG. 16.

Referring to FIGS. 15 and 16, it is understood that ringing can effectively be suppressed by employing the slower amplifier. In other words, ringing can effectively be suppressed by using the filter which utilizes the through-rate of the amplifier.

Figure 17:
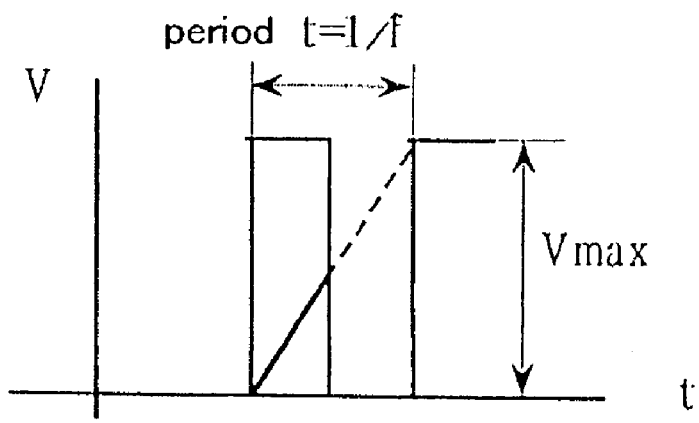
FIG. 17 is a diagram illustrating a current waveform due to a slow amplifier.

When the square wave with the frequency f and amplitude Vmax is amplified by the amplifier having the through-rate f×Vmax (V/s), the amplitude becomes the amplitude Vmax/2, as is illustrated in FIG. 17 so that it becomes the cutoff frequency with respect to that component of a greater frequency is greatly reduced while a component of smaller frequency passes through.

Figure 18:
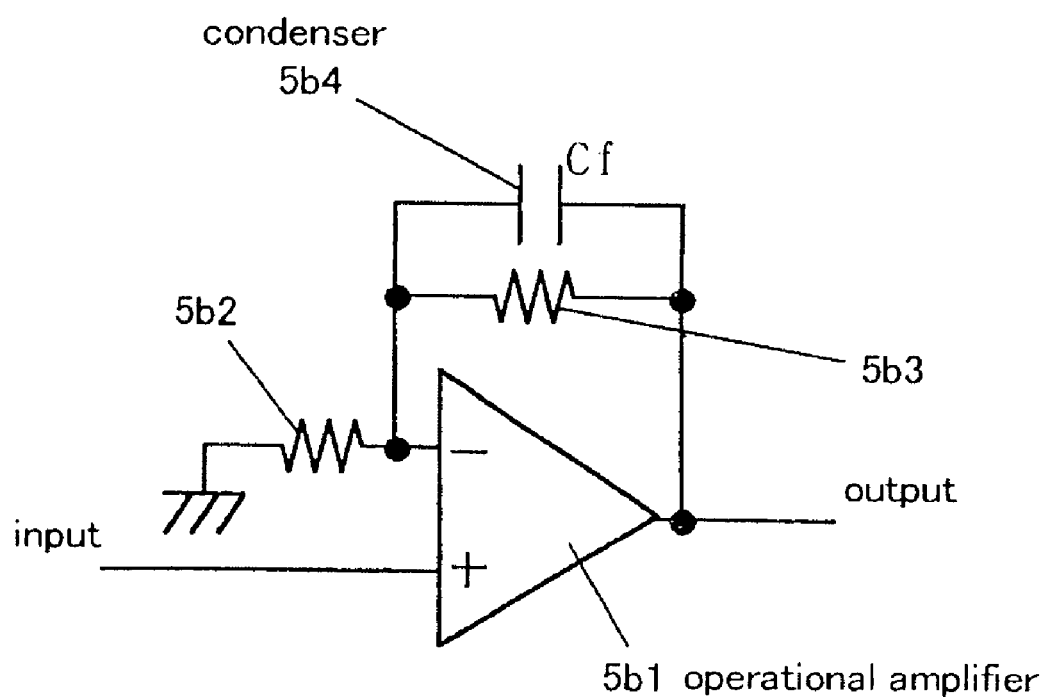
FIG. 18 is a diagram illustrating an arrangement of an amplifier which is restricted its bandwidth by a period capacitance.

FIG. 18 is an electric circuit diagram illustrating an arrangement of a current outputting section 5b of an embodiment of the present invention.

This current outputting section 5b has an operational amplifier 5b1, a resistor 5b3 and a condenser 5b4. An input signal is supplied to the non-inversion input terminal of the operational amplifier 5b1, the inversion input terminal of the operational amplifier 5b1 is connected to the ground via a resistor 5b2, and an output signal is output from the output terminal of the operational amplifier 5b1. The resistor 5b3 and the condenser 5b4 are connected in parallel to one another between the non-inversion input terminal and the output terminal of the operational amplifier 5b1.

Figure 19:
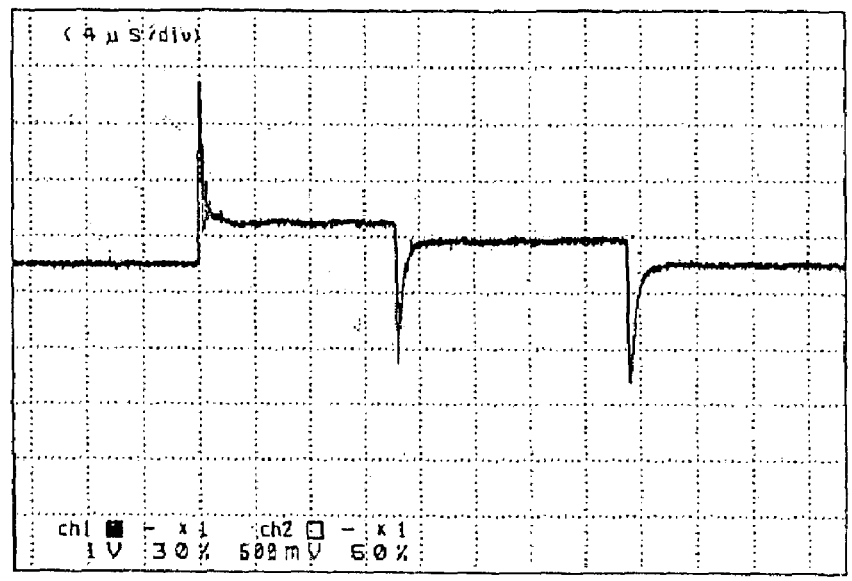
FIG. 19 is a diagram illustrating a current waveform in a case that a condenser is omitted.
Figure 20:
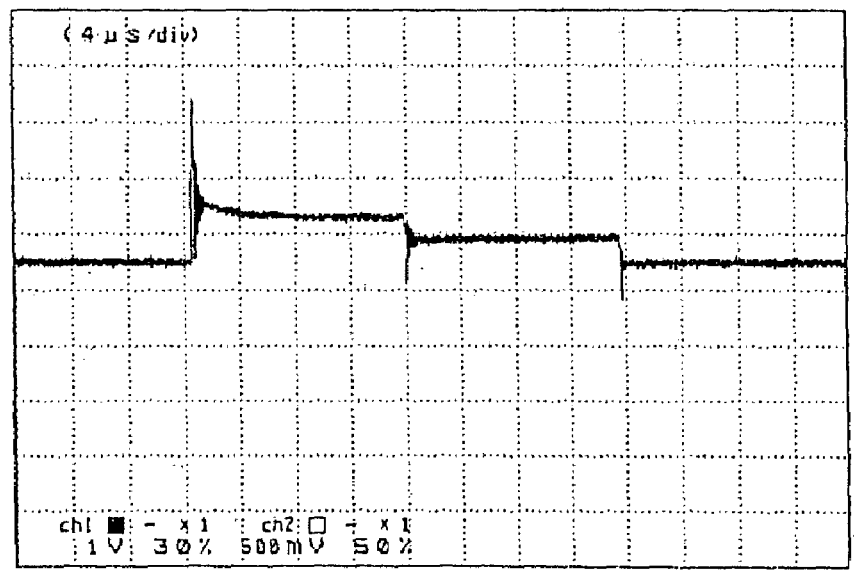
FIG. 20 is a diagram illustrating a current waveform in a case that a condenser is provided.

The actual measurement waveform in a case that the condenser 5b4 is omitted, is illustrated in FIG. 19 while the actual measurement waveform in a case that the condenser 5b4 is provided, is illustrated in FIG. 20. When FIGS. 19 and 20 are compared to one another, it is understood that not only overshoot but also undershoot are greatly reduced by providing the condenser 5b4, and that speeding up is realized despite the restriction in bandwidth.

Figure 21:
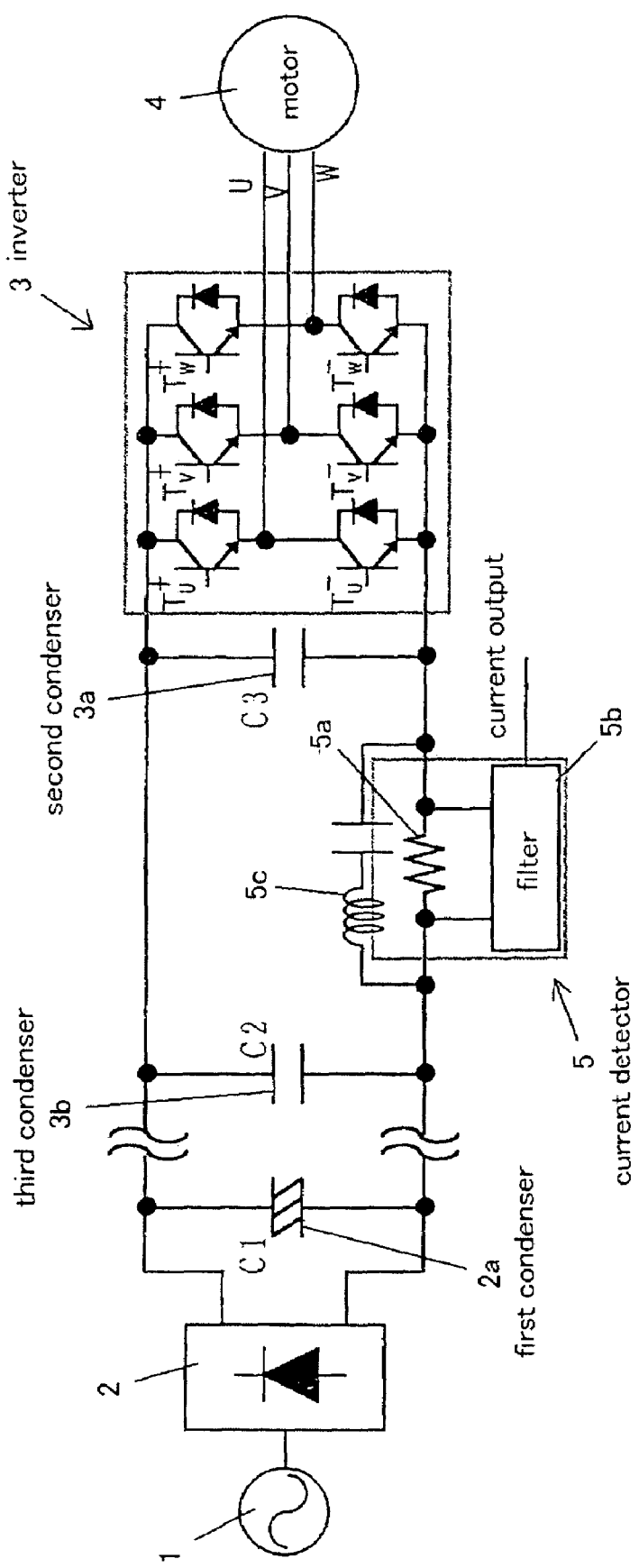
FIG. 21 is a diagram illustrating an arrangement of a motor driving apparatus in which a phase current detection apparatus of another embodiment of the present invention is applied.

FIG. 21 is a diagram illustrating an arrangement of a motor driving apparatus to which a phase current detection apparatus of another embodiment according to the present invention is applied.

This motor driving apparatus is different from the motor driving apparatus of FIG. 6 in that a LC serial resonance circuit 5c is connected to the shunt resistor 5a in parallel. The resonance frequency of this LC serial resonance circuit 5c is matched to the ringing frequency generated by the wiring from the third condenser 3b to the power devices, wiring from the power devices to the motor 4, and the motor 4.

When this arrangement is employed, the current due to ringing is bypassed by the LC serial resonance circuit 5c so that the current detection accuracy is improved.

Figure 22:
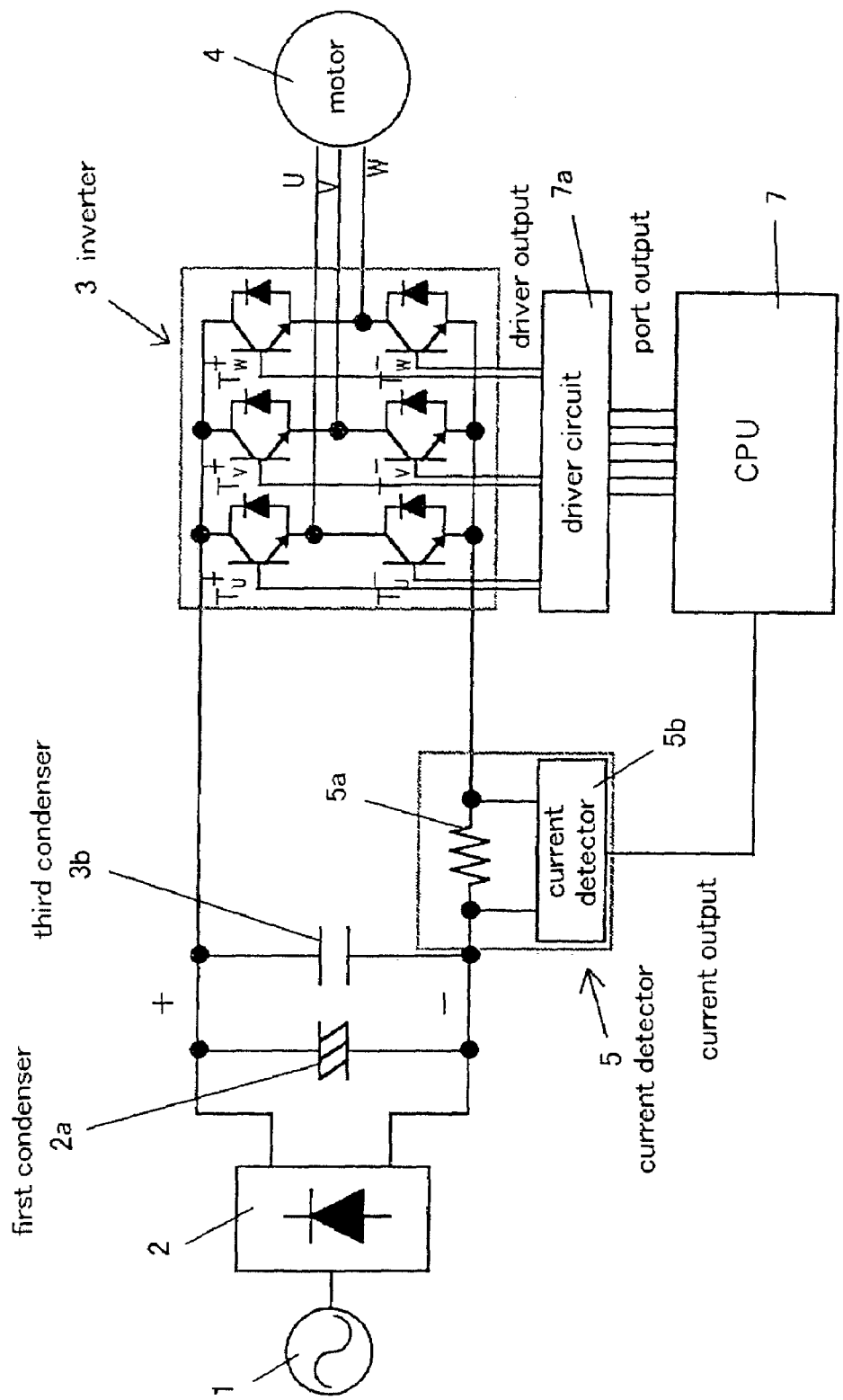
FIG. 22 is a diagram illustrating an arrangement of a motor driving apparatus in which a phase current detection apparatus of a further embodiment of the present invention is applied.

FIG. 22 is a diagram illustrating an arrangement of a motor driving apparatus to which a phase current detection apparatus of a further embodiment according to the present invention is applied.

This motor driving apparatus is different from the motor driving apparatus of FIG. 6 in that the current output from the current detector 5 is supplied to a CPU 7, the port output from the CPU 7 is supplied to a driver circuit 7a, and the driver output from the driver circuit 7a is supplied to the inverter 3 (power devices).

When this arrangement is employed, the current detector 5 sequentially detects current flowing in the DC link and supplies to the CPU 7.

The CPU 7 samples the current at every current detection timing, and detects a phase current based upon the processing disclosed in the cited reference. Then, the CPU 7 carries out the processing for motor driving such as speed controlling, current controlling and the like, and specifies an output voltage vector for the driver circuit 7a. The driver circuit 7a drives switching elements of the power devices according to the command of the CPU 7 so that the inverter 3 supplies voltages (currents) to the motor 4. The cited reference utilizes the fact that the phase current appears on the DC link depending upon the switching condition of the power devices, and detects the phase currents. This motor driving apparatus detects the phase current similarly.

When the phase current is detected in the motor driving apparatus having the above arrangement, the current detection for a thin pulse becomes the problem as is illustrated in the cited reference.

When the extremely thin pulse is output (voltage vector length is extremely short), processing such as restricting the minimum pulse width (minimum voltage vector length) or the like, because the current measurement is impossible to be realized. But, when the minimum voltage vector length becomes longer, a disadvantages arises in that voltage vectors which cannot be output, are increased so that the voltage (current) waveform is deformed. Therefore, it is necessary that the minimum voltage vector length is determined to be as short as possible.

Elimination of the effect of ringing or the like for the thin pulse is described in the foregoing, but it is necessary that the detection timing is matched to the current by taking the delay due to devices and the like into consideration for performing accurate current detection.

Figure 23:
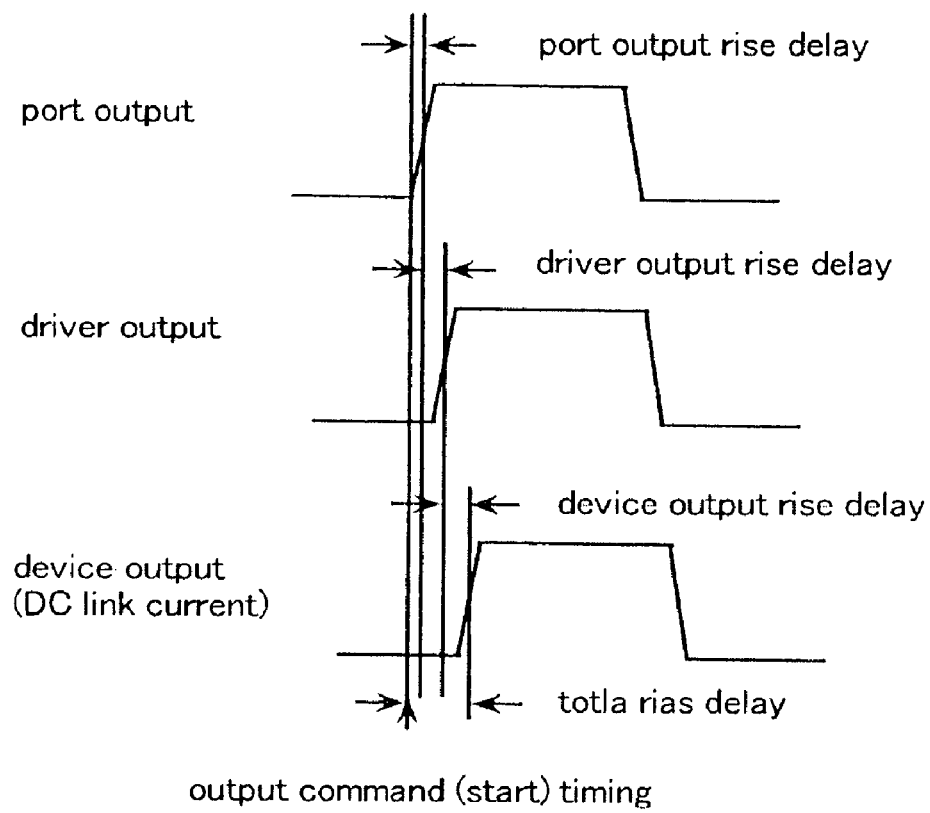
FIG. 23 is a diagram useful in understanding a delay time of each section.

Delay of each section is illustrated in FIG. 23.

The port delay of the CPU 7, the delay of the driver circuit 7a, and the delay of the power device are added, and the sum becomes the entire delay. Although only the delay in rise is illustrated in FIG. 23, the delay in descent is similarly generated.

In a known circuit, these delays are several hundreds ns, respectively, and the total delay is 500 ns to 1 µs which varies to about twice this value depending upon temperature, dispersion, and the like. Therefore, the change in delay time cannot be ignored when pulse restriction of less than about 1 µs is considered.

By taking this into consideration, one or plural relationships of at least rise delay time or descent delay time for current waveform of current flowing in the DC link corresponding to the command of the CPU 7 are measured, then the current detection timing or minimum voltage vector is determined based upon the measurement result, thereby the detection timing can be matched to the current.

Figure 24:
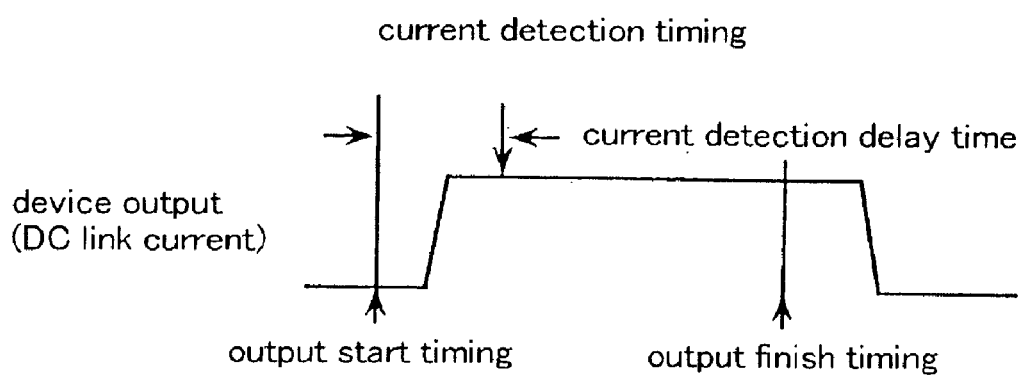
FIG. 24 is a diagram useful in understanding measurement of a current waveform.
Figure 25:
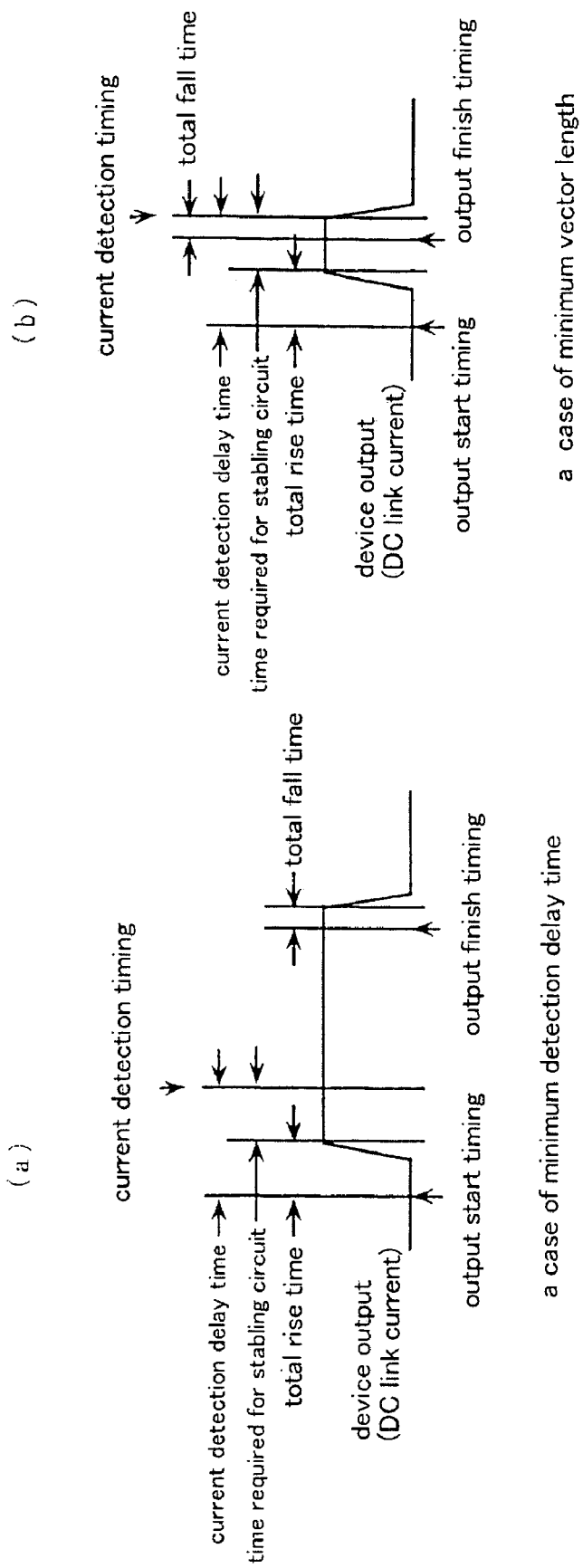
FIG. 25 is a diagram useful in understanding detection of a current.

Description is made further with reference to FIG. 24.

FIG. 24 is a diagram useful in understanding the measurement method of current waveform. It is assumed that the power device output is output after each delay from the output command timing.

Because the current waveform is a repetition waveform at every PWM, although the times each from the output start to the output stop are different from one another, it is thought that waveform of similar shape is repetitively output at every PWM interval.

When the current is detected at various current detection delay times for every PWM, it is measured in the waveform being output from the output start timing. Similarly in the descent, it is also measured in the waveform being output from the output stop timing.

Therefore, entire rise delay time, descent delay time, ringing waveform in rise, and the like are obtained by this operation.

It is sufficient that the total rise time plus the convergence time of ringing waveform (time until the circuit being stabilized) is determined to be the lower limit of the current detection delay time, as is illustrated in F*ig*. 25(*a*), and that the total rise time plus the time until the circuit being stabilized minus the total descent time (the total descent time is a time from the output stop timing until the descent starting) is determined to be the lower limit of the minimum vector length, then the phase current is accurately measured despite the delay time. Of course, the lower limit values are employed as the minimum values, respectively.

It is assumed that the delay such as acquisition time of the current detector 5 is detected as being included in each delay, because the measurement is performed using the current detector 5 of the apparatus of FIG. 22.

It is preferable that the measurement of each delay time for the command of the CPU 7 is carried out under a condition that a DC current flows to the motor 4 at the start. In this case, the current value does not change, and the PWM width does not change, therefore, accurate measurement can be performed. The measurement is carried out at the start, because flowing DC current after starting is difficult.

It is also preferable that the triangle comparison method is employed for PWM waveform generation, and that the measurement of delay time and the like corresponding to the command of the CPU 7 and the current measurement for phase current detection are carried out at the rising slope and the descending slope, respectively.

Figure 26:
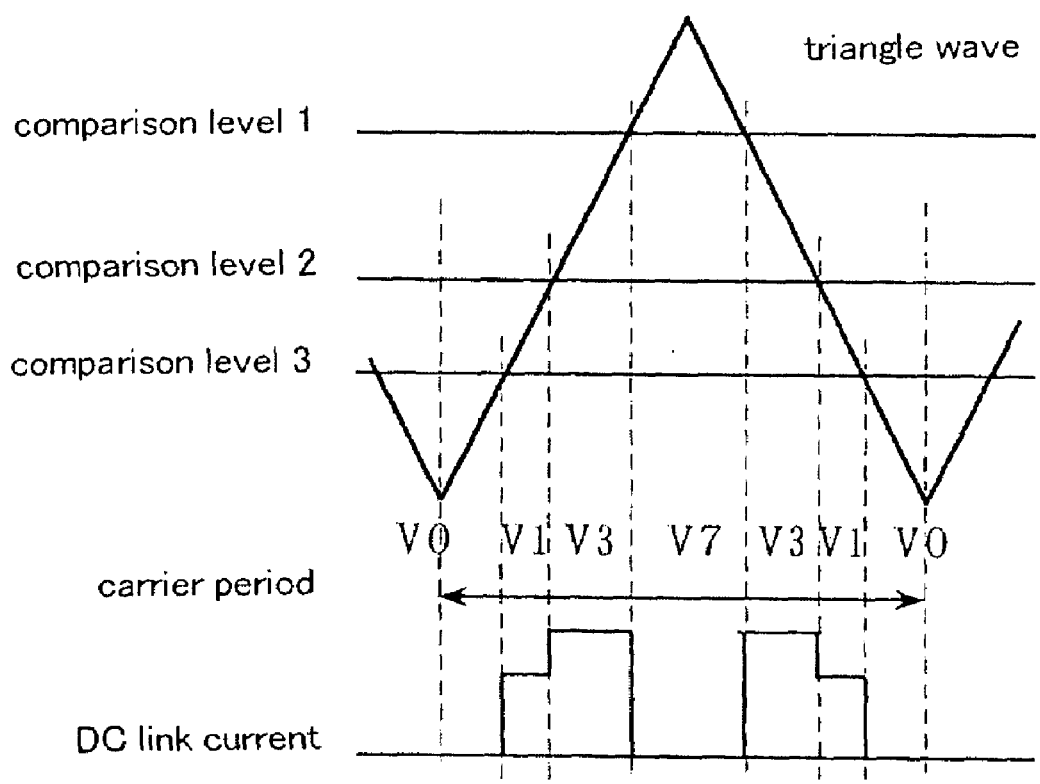
FIG. 26 is a diagram illustrating a DC link current in a case that the triangle wave comparison method.

FIG. 26 is a diagram illustrating the DC link current in the triangle wave comparison method.

Vn is an example of an output voltage vector. In the triangle wave comparison method, two voltage vectors in synch to one another are output within one carrier so that two current waveforms in synch to one another are observed. Therefore, it is preferable that one is used for phase current detection while the other is used for delay time measurement. Thereby, the phase current measurement is carried out with measurement of the delay time always so that current detection accuracy is improved.

When the sawtooth comparison method is employed for PWM waveform generation, it is impossible that the phase current detection and the delay time measurement are carried out within one carrier, because synchronism as described above does not exist. But, in this case, current detection accuracy is improved by properly stopping the phase current detection and carrying out the delay time measurement.

An enclosed compressor can be driven by the motor 4 which is driven by each of the above motor driving apparatus.

An enclosed compressor is usually driven by the position sensor-less motor (method for detecting a rotational position of a rotor without a position sensor). In recent years, it is effective that each of the above embodiments is applied which accurately detects the phase voltage from the DC link current, because the technique for detecting a rotational position of a rotor using phase voltages, phase currents, and equipment constants has been developed.

An enclosed compressor has an arrangement that a motor is disposed within a space in which coolant and refrigerating machine oil are enclosed, therefore the dielectric constant is greater than that in the air. Consequently, it is particularly effective that the embodiments of FIGS. 8–26 are applied.

Next, an embodiment is described which carries out phase current detection using a shunt resistor.

Figure 27:
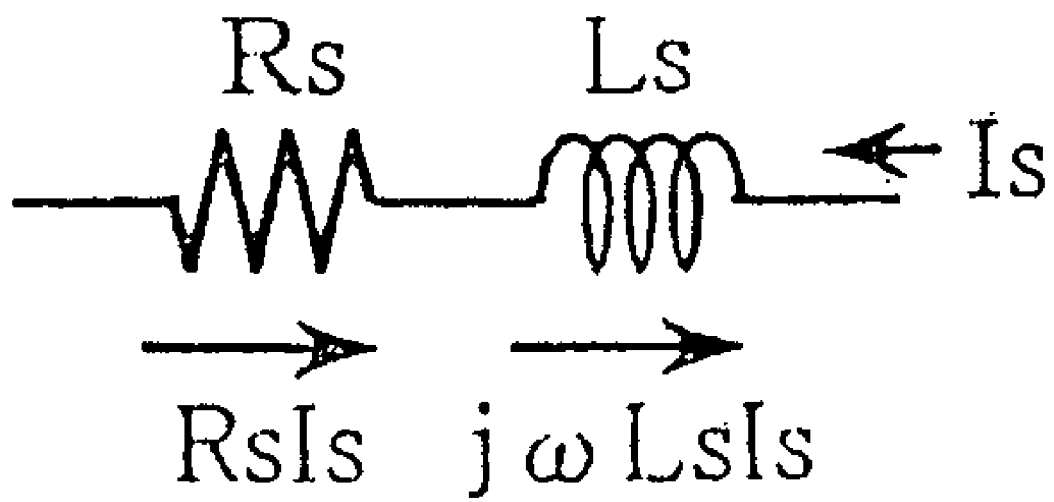
FIG. 27 is an equivalent circuit diagram of a shunt resistor.

FIG. 27 is a diagram illustrating an equivalent circuit of the shunt resistor. A resistance component Rs and a parasitic inductance Ls are connected in series.

Providing the current flowing in the shunt resistor to be Is, and the frequency to be ω, the parasitic inductance generates the electromotive force of $j\omega L_s I_s$ causing measurement error. This error becomes greater for higher frequency component, so that it becomes the great problem particularly when measurement of high frequency current such as pulse current is carried out.

Figure 28:
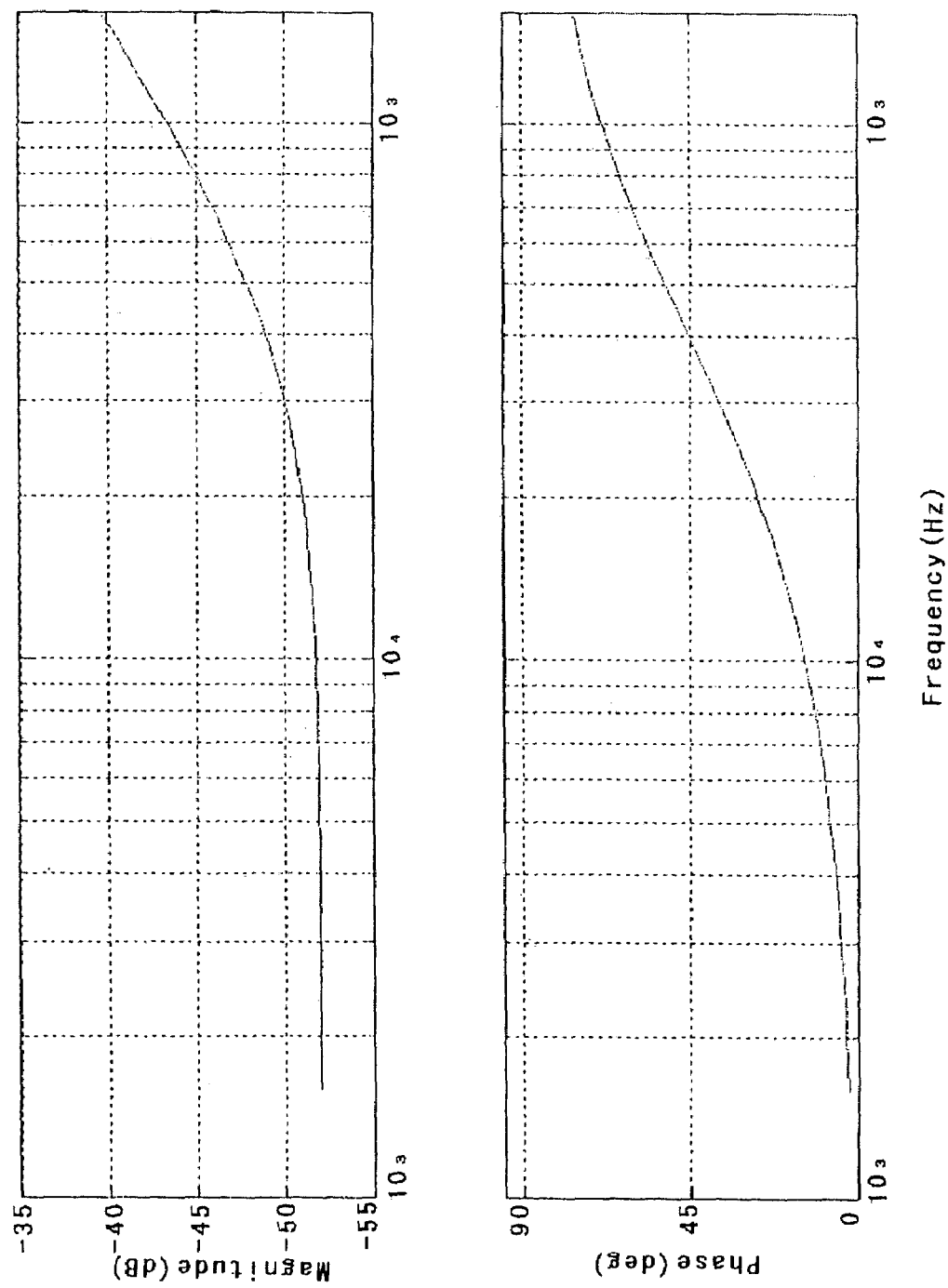
FIG. 28 is a diagram illustrating characteristics of a shunt resistor.

A Bode diagram of a transfer function from Is when Rs=0.0025 O and Ls=10 e$-^9$ to detected voltage (Rs+jω)Ls) Is illustrated in FIG. 28. It is understood from FIG. 28 that zero exists at about 40 kHz, and that amplitude is increased at frequencies equal to or greater than the frequency. When a conventional current detection circuit is designed, noise is decreased by restricting band which is equal to or greater than the necessary current detection band. When a pulse current is to be measured, current detection band of about 1 MHz is required. Therefore, a disadvantage arises in that a high frequency current becomes a noise so that accurate current measurement cannot be carried out in the shunt resistor having such zero.

This effect is suppressed so that current detection is carried out accurately and rapidly by providing a filter to the current detector, the filter canceling electromotive force due to the parasitic inductance Ls.

Figure 29:
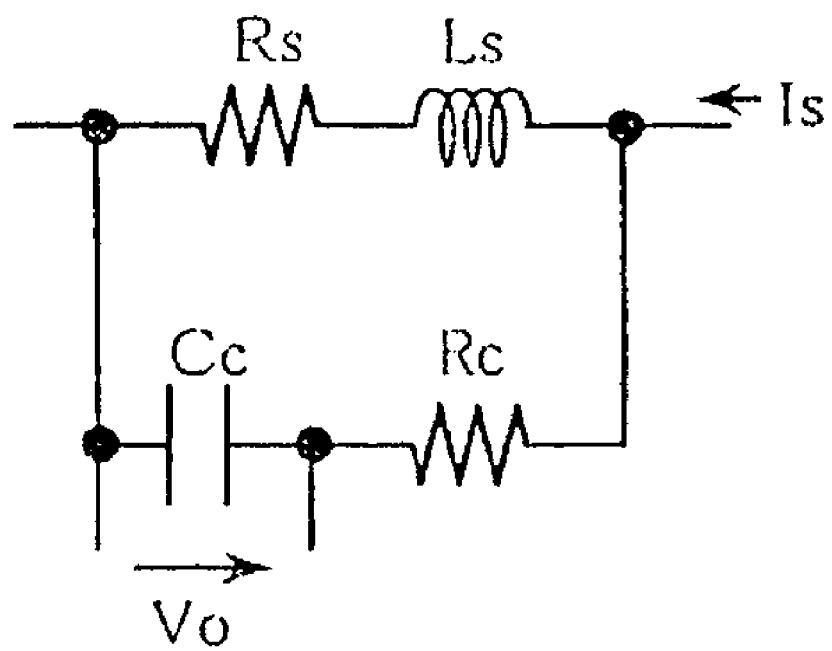
FIG. 29 is an electric circuit diagram illustrating a connection situation of a filter to a shunt resistor.

FIG. 29 is a diagram illustrating this circuit arrangement of an example. An RC filter is provided at the output of the shunt resistor.

A condenser Cc and a resistor Rc for canceling electromotive force due to the parasitic inductance Ls are determined to satisfy the relationship of CcRc=Ls/Rs.

Transfer function from a voltage generated at the shunt resistor to the output V0 becomes (jωCcRc+1).

Figure 30:
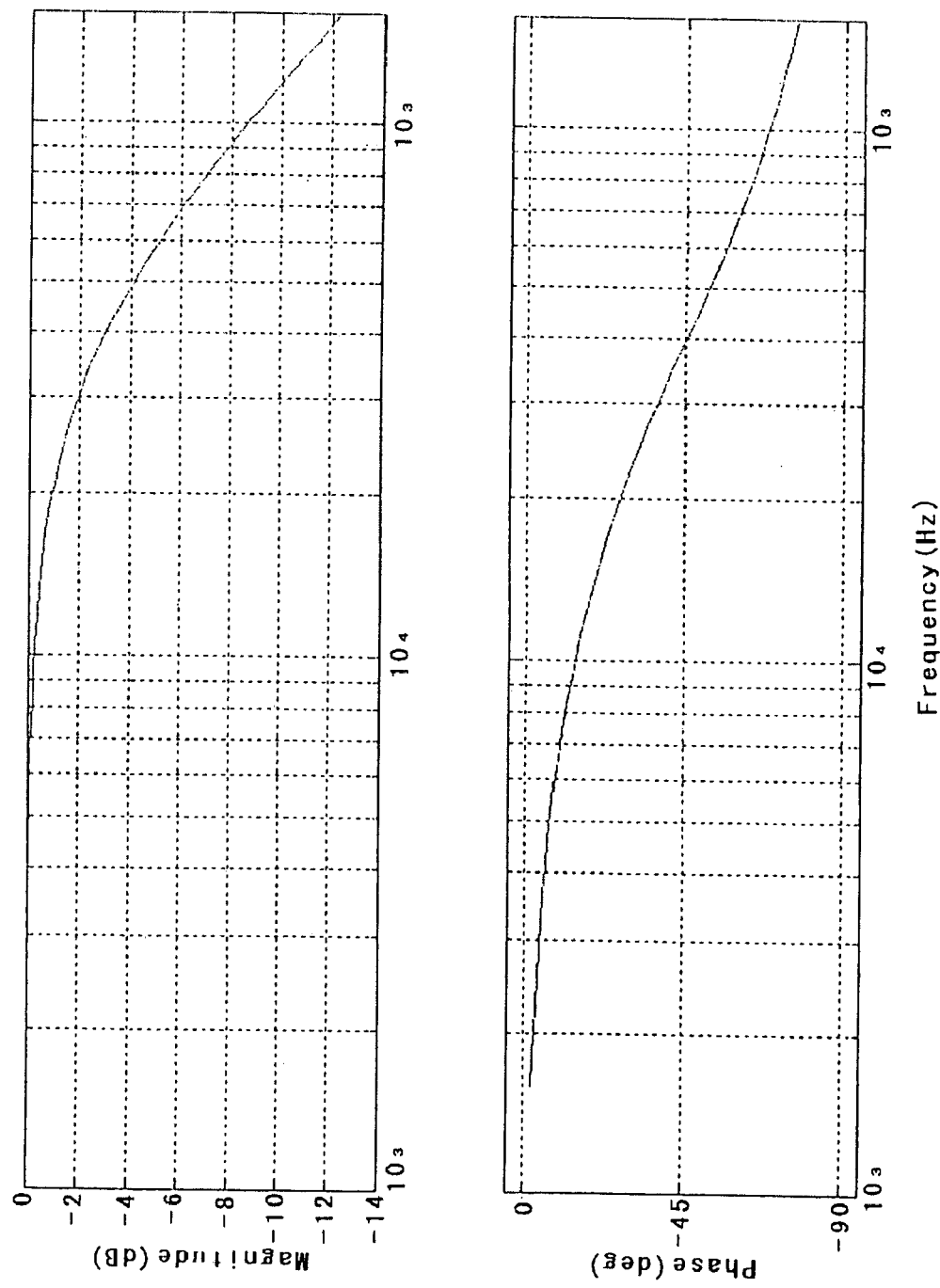
FIG. 30 is a diagram illustrating characteristics of an inductance canceling filter.

When the transform function where Cc=0.1 e$^{-6}$ F, and Rc=40 O is represented with a Bode diagram, the diagram becomes a diagram which is illustrated in FIG. 30 so that it is understood that a pole exists at about 40 kHz.

Figure 31:
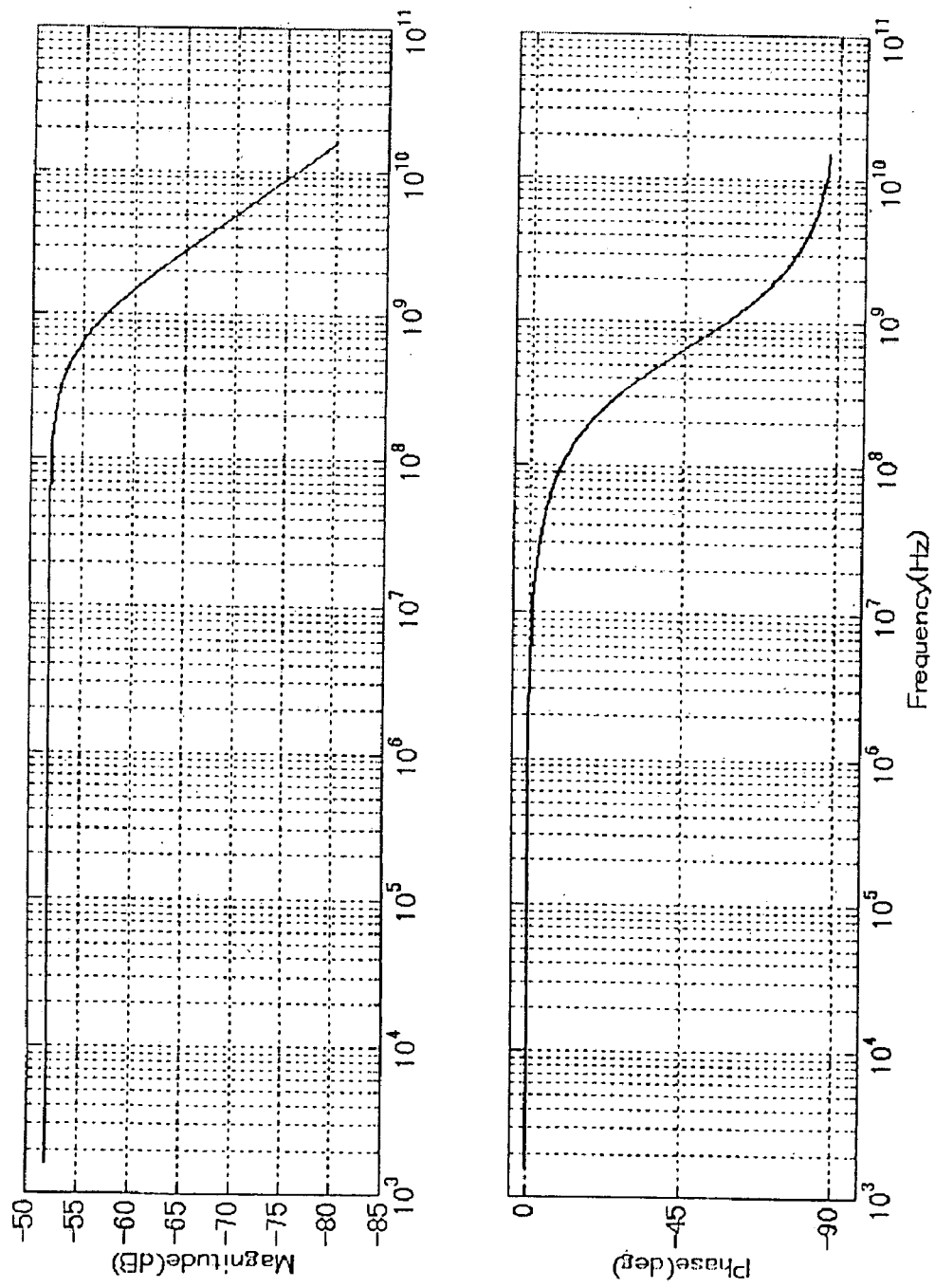
FIG. 31 is a diagram illustrating characteristics of a current detection circuit including an inductance canceling filter.

The transfer function from the current Is to the output Vo at that condition becomes VO=(Rs+jωLs)Is/(1+jωCc(Rs+Rc)−ω$^2$LsCc), and characteristics become flat characteristics up to more than 100 MHz, as is illustrated in FIG. 31 and also become characteristics attenuating in high frequency region, so that no effect due to noise exists and that phase current can be measured accurately.

That is, flat characteristics for more than 100 MHz are obtained by determining the pole at a frequency (for example, 40 kHz) which is lower than the band (for example, 1 MHz) required for the current detection circuit.

The shift between the pole and the zero appears as the gain difference between the high frequency and the low frequency so that the frequency characteristics can be shaped to a desired shape by having a slight shift.

For example, it can be determined to be that a high frequency gain is greater than a low frequency gain so as to enhance the rise of the pulse, by determining pole to be greater than zero. When the shift becomes too great, the shift causes measurement error. Therefore, it is preferable that adjustment is determined to be approximate adjustment within the range avoiding measurement error.

Figure 32:
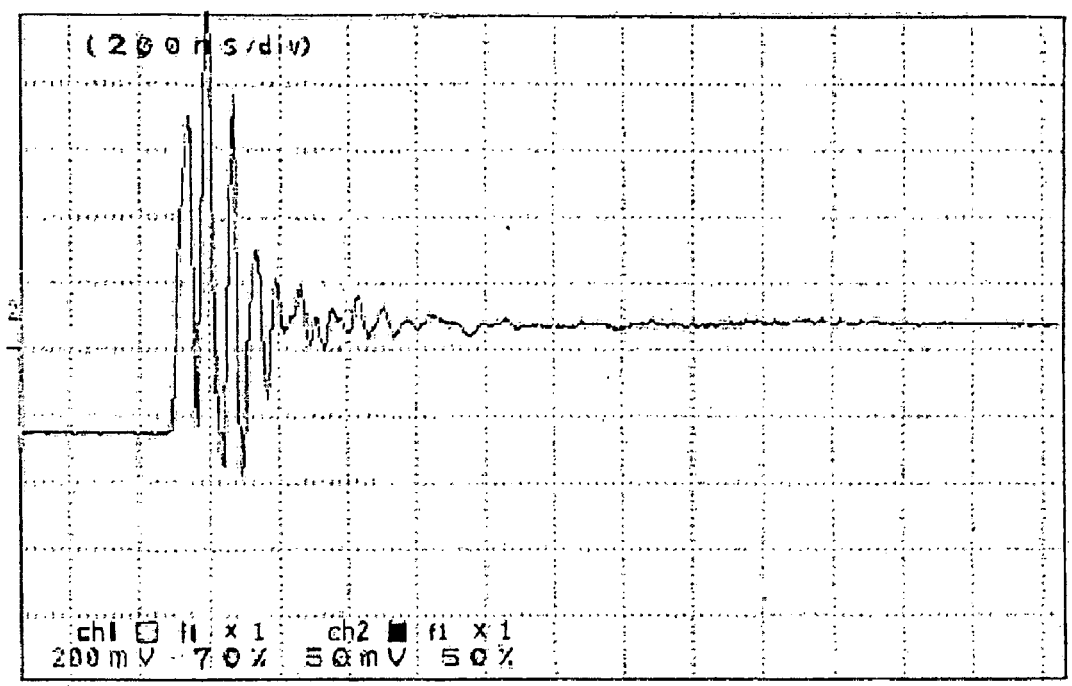
FIG. 32 is a diagram illustrating a current measurement waveform under a condition that parasitic inductance is cancelled.
Figure 33:
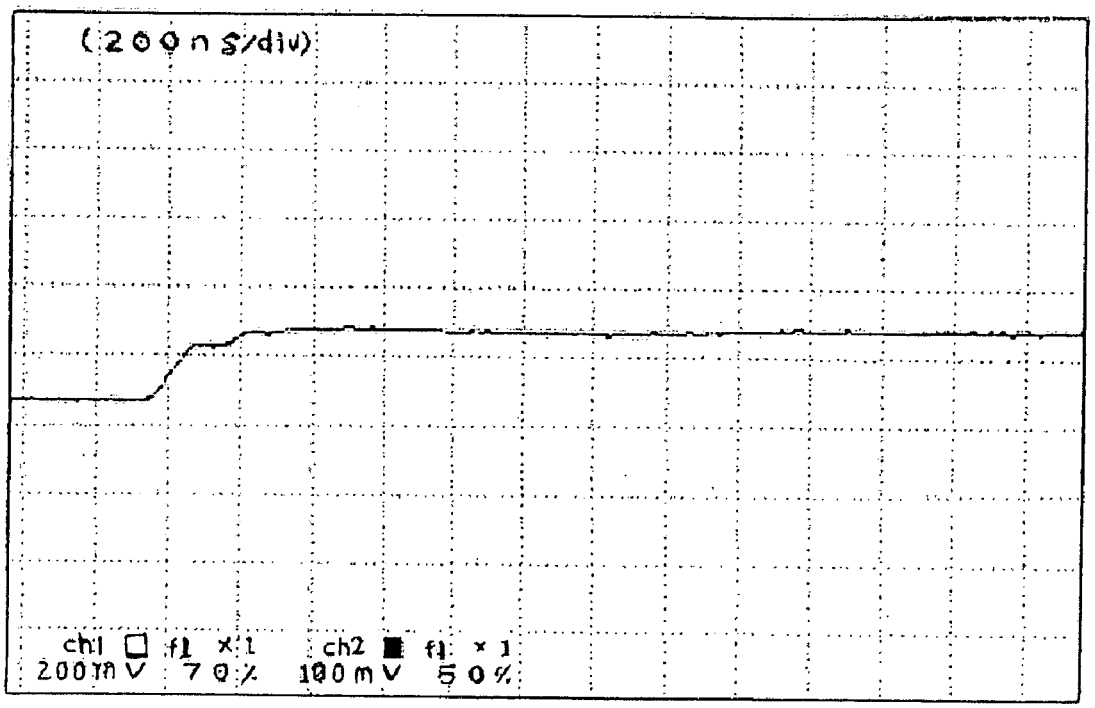
FIG. 33 is a diagram illustrating a current measurement waveform under a condition that unnecessary oscillation component is cancelled.

In the shunt resistor, current component flows which prohibits measurement of ringing current and the like. By filtering this component further, measurement with extremely small error and with high accuracy can be performed. Measurement waveform in actual use when parasitic inductance Ls is canceled, is illustrated in FIG. 32, while measurement waveform in actual use when unnecessary oscillation component is canceled, is illustrated in FIG. 33. As is understood from FIGS. 32 and 33, extremely good current measurement is possible by applying two species of filtering.

As described above, zero of about several tens kHz may be generated due to the inductance component which is parasitic to the shunt resistor. When a pulse current having component of several MHz is measured, a great peak voltage is generated. When it is input directly to an active element such as amplifier or the like, accurate amplification cannot be carried out or very expensive circuit arrangement must be used by the affection of the restriction in through rate and dynamic range of an amplifier.

So, the waveform is previously passed through the filter so as to be shaped to the waveform suitable for measurement, and then the shaped waveform is input to the active element such as amplifier, so that current measurement becomes possible without the above problems.

It may be possible that a filter is provided at a later stage with respect to an active element such as an amplifier which is determined its dynamic range to be a great range, this arises problem when the current detector is to be integrated because the filter is difficult to be integrated. Said filter observes extremely good current waveform so that the circuit at a later stage with respect to the filter can be integrated by disposing the filter nearby to the shunt resistor.

Figure 34:
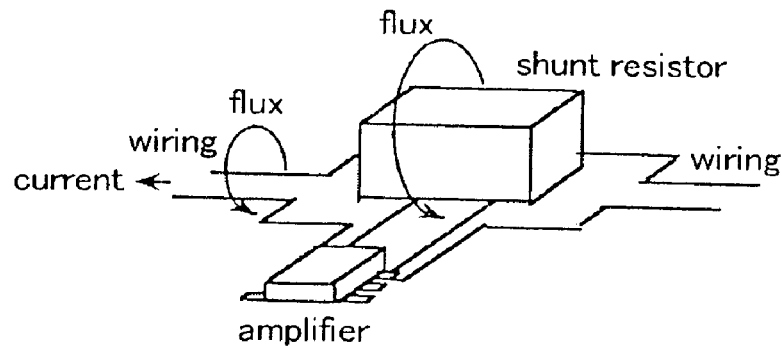
FIG. 34 is a diagram useful in understanding a relationship between a loop and a generated flux under a condition that noise canceling measure, the loop being between a shunt resistor and an amplifier.

As is illustrated in FIG. 34, magnetic flux is generated around the shunt resistor when current flows in the shunt resistor. When this flux passes though within a loop which is formed with the both ends of the shunt resistor and a circuit such as an amplifier or the like, electromotive force is generated. This electromotive force becomes to be noise so that measurement error is generated. Therefore, this noise is reduced by designing the loop as small as possible in usual case, there exist a limit in reducing noise based upon restriction in the size of the shunt resistor, restriction in position for disposing the amplifier, and the like. But, noise reduction is realized by providing a noise canceling section for preventing the electromotive force due to flux linkage.

Figure 35:
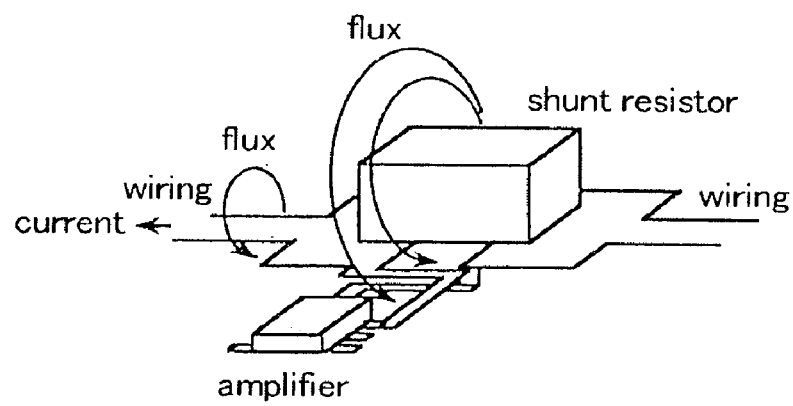
FIG. 35 is a diagram useful in understanding a condition which cancels flux at shunt resistor side and amplifier side by crossing a loop between a shunt resistor and an amplifier.

FIG. 35 illustrates one example thereof. Here, the arrangement is employed that the loops formed by the wiring are crossed so that flux in the shunt resistor side and flux in the amplifier side are canceled. Therefore, the electromotive force due to flux linkage is canceled so that current detection accuracy is improved.

Figure 36:
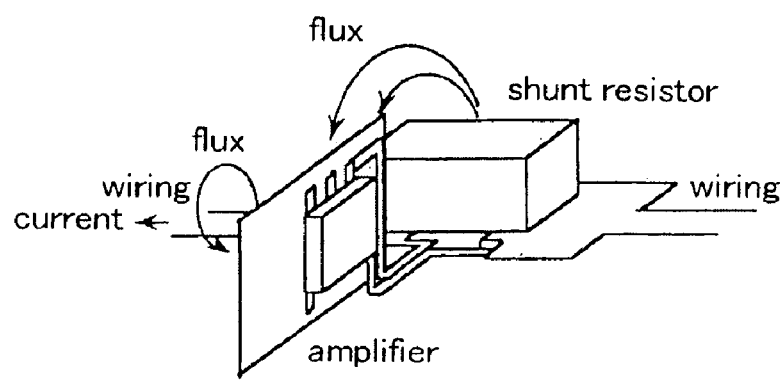
FIG. 36 is a diagram illustrating a condition that an amplifier is implemented in parallel to a plane which is formed by flux.

FIG. 36 is a diagram illustrating implementation arrangement which is not affected by noise due to flux. Here, the arrangement not to be affected by flux is realized by disposing the circuit in parallel with respect to a plane formed with flux due to the current.

Figure 37:
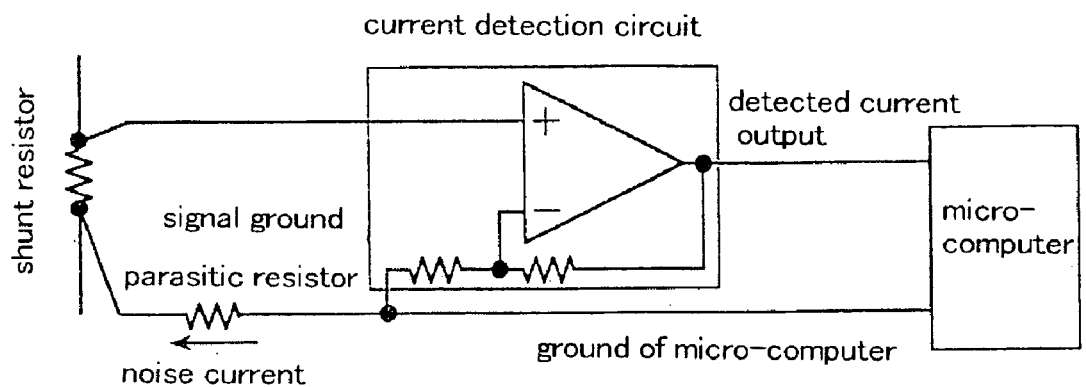
FIG. 37 is a diagram illustrating a conventional connection condition of a signal ground of a current detection circuit and a ground of a micro-computer.
Figure 38:
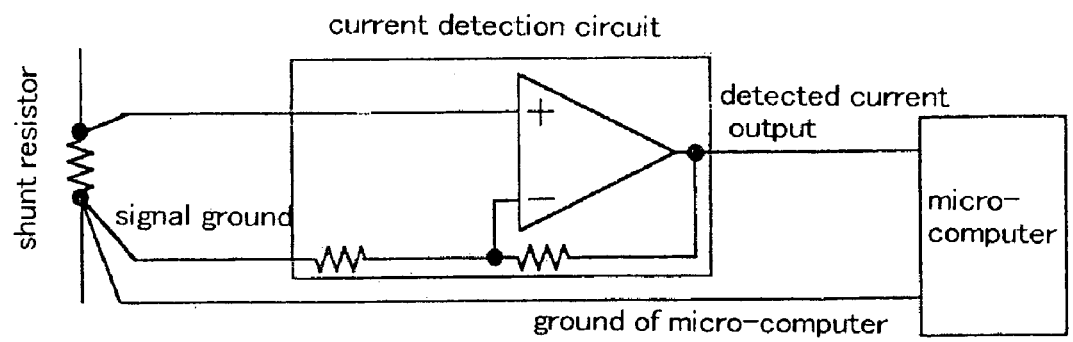
FIG. 38 is an electric circuit diagram illustrating a condition that a signal ground of a current detection circuit and a ground of a micro-computer at one side of a shunt resistor.

When the wiring illustrated in FIG. 37 is realized, error is generated in measurement current by the noise current and parasitic resistance on the wiring. Noise generated in the input of the current detection circuit can be reduced by providing said noise canceling section, and by employing the implementation arrangement not to receive noise or evading noise. But, it is not easy that noise current flowing in the ground of the micro-computer is reduced. Therefore, the signal ground of the current detection circuit and the ground of the micro-computer are connected to one another at one end of the shunt resistor, as is illustrated in FIG. 38. Consequently, it is prevented from occurrence that the current flowing in the ground of the micro-computer changes the potential of the signal ground and making it as noise, so that current measurement with accuracy can be realized.

Figure 39:
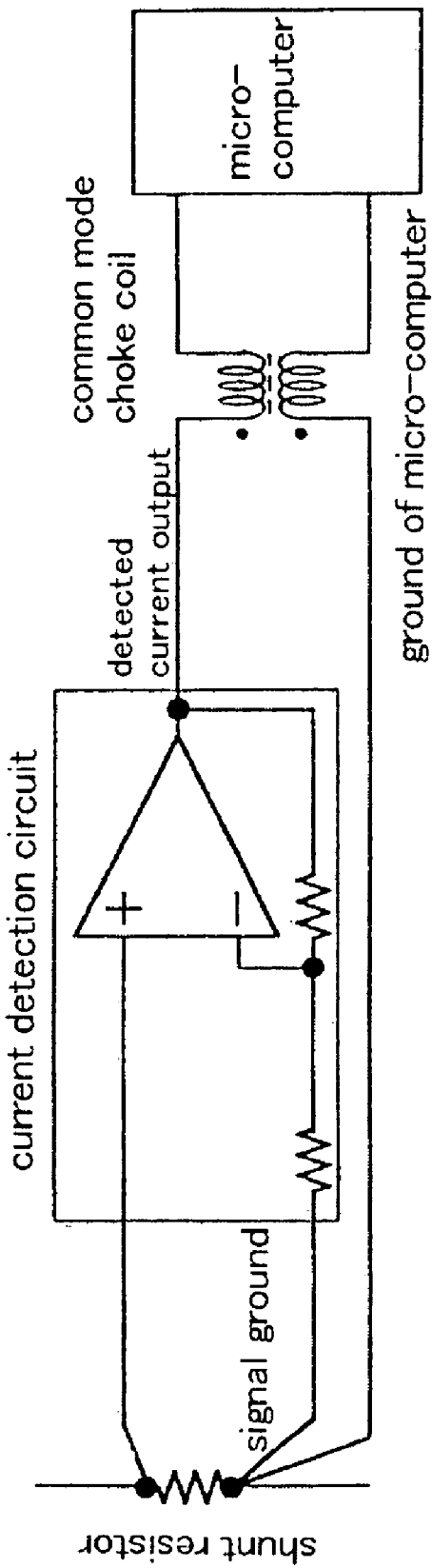
FIG. 39 is an electric circuit diagram illustrating a condition that a common mode choke coil is inserted to a detected current output and a ground of a micro-computer.

By providing a common mode choke coil as illustrated in FIG. 39, the common mode signal is prevented from being transferred, and noise current flowing in the ground of the micro-computer is reduced, so that noise is prevented from being generated.

The disclosed invention of has the characteristic effect such that current detection accuracy is improved by preventing ringing of current due to resonance from flowing in the current detector.

The disclosed invention has the characteristic effect such that measurement error is greatly decreased and current measurement accuracy is improved.

The disclosed invention has the characteristic effect such that the effect of resonance current is suppressed to nearly zero and current measurement accuracy is improved.

The disclosed invention has the characteristic effect such that the component of the ringing frequency is sufficiently suppressed within measurement error, and the current detection accuracy is improved.

The disclosed invention has the characteristic effect such that varying in wiring length and the like can be flexibly performed.

The disclosed invention has the characteristic effect such that the component of the ringing frequency is sufficiently suppressed, and the current measurement accuracy is improved.

The disclosed invention has the characteristic effect such that not only overshoot but also undershoot is greatly reduced.

The disclosed invention of has the characteristic effect such that the effect of ringing is reduced, and current detection accuracy is improved.

The disclosed invention has the characteristic effect such that the effect of delay and the like due to devices is reduced, and current detection accuracy is improved.

The disclosed invention has the characteristic effect such that delay time is measured under a condition that current value does not vary and that PWM width does not vary, so that current detection accuracy is improved.

The disclosed invention of has the characteristic effect such that delay time is always measured while current is detected, and current detection accuracy is improved.

The disclosed invention of has the characteristic effect such that measurement of delay time is carried out by stopping phase current detection properly, and current detection accuracy is improved, even when a system not having symmetry is employed.

The disclosed invention has the characteristic effect disclosed above even when an enclosed compressor is driven.

The disclosed invention of has the characteristic effect such that accuracy of phase current detection is improved.

The disclosed invention has the characteristic effect such that a flat characteristic for a wide range is realized so that accuracy of phase current detection is improved.

The disclosed invention has the characteristic effect such that a flat characteristic for a wide range is realized so that accuracy of phase current detection is improved.

The disclosed invention has the characteristic effect such that the effect of unnecessary oscillation is removed.

The disclosed invention has the effect by the arrangement reduces error due to asymmetry and is lower in cost.

The disclosed invention has the characteristic effect such that accuracy of phase current detection is improved.

The disclosed invention has the characteristic effect such that accuracy of phase current detection is improved.

The disclosed invention has the characteristic effect such that potential of signal ground is prevented from varying despite current flowing in the micro-computer ground, and accuracy of phase current detection is improved.

The disclosed invention has the characteristic effect such that transmission of common mode signal is prevented, noise current flowing in the micro-computer ground is reduced, and accuracy of phase current detection is improved.

What is claimed is:

1. A phase current detection apparatus that detects a phase current of a motor based upon a current of a DC link and a vector pattern applied to the motor, the motor being provided in a motor driving apparatus which supplies outputs from a PWM inverter to the motor to drive the motor, comprising:
   a bypass condenser connected to an input side of the PWM inverter, the bypass condenser being in parallel with a first condenser of the motor driving apparatus, the bypass condenser also being further downstream from a rectifier of the motor driving apparatus relative to the first condenser;
   a third condenser connected in between the first and bypass condensers and in parallel with both the first and bypass condensers; and
   a current detector on the DC link of the motor driving apparatus in series between the third condenser and the bypass condenser; and
   a low-pass filter connected to and parallel with the current detector,
   wherein a cut-off frequency of the lowpass filter is set to a frequency to substantially suppress a component of a ringing frequency of the motor driving apparatus,
   wherein the component of the ringing frequency is generated based upon wiring from the bypass condenser to power devices, wiring from the power devices to the motor, and within the motor.

2. The phase current detection apparatus as set forth in claim 1, wherein the low-pass filter includes changeover means for changing over cut-off frequencies.

3. A phase current detection apparatus that detects a phase current of a motor based upon a current of a DC link and a vector pattern applied to the motor, the motor being provided in a motor driving apparatus which supplies outputs from a PWM inverter to the motor to drive the motor, comprising:
   a bypass condenser connected to an input side of the PWM inverter, the bypass condenser being in parallel with a first condenser of the motor driving apparatus, the bypass condenser also being further downstream from a rectifier of the motor driving apparatus relative to the first condenser;
   a third condenser connected in between the first and bypass condensers and in parallel with both the first and bypass condensers;
   a current detector on the DC link of the motor driving apparatus in series between the third condenser and the bypass condenser; and
   a filter connected to and parallel with the current detector,
   wherein the filter has a response speed which enables detection of a current at a predetermined minimum voltage vector length, and
   wherein a line length from the inverter to the motor is matched by the filter so as to have a frequency which is equal to or more than a frequency to suppress ringing generated based upon wiring from the bypass condenser to power devices, wiring from the power devices to the motor, and within the motor.

4. The phase current detection apparatus as set forth in claim 3, wherein the filter includes a lowpass filter which utilizes a through-rate of an amplifier.

5. The phase current detection apparatus as set forth in claim 4, wherein the amplifier has a through-rate which is equal to or less than a value obtained by multiplying a ringing frequency and a maximum output voltage.

6. The phase current detection apparatus as set forth in claim 4, wherein the amplifier includes an operational amplifier having a bandwidth corresponding to a feedback capacitance.

7. A phase current detection apparatus that detects a phase current of a motor based upon a current of a DC link and a vector pattern applied to the motor, the motor being provided in a motor driving apparatus which supplies outputs from a PWM inverter to the motor to drive the motor, comprising:
- a bypass condenser connected to an input side of the PWM inverter, the bypass condenser being in parallel with a first condenser of the motor driving apparatus, the bypass condenser also being further downstream from a rectifier of the motor driving apparatus relative to the first condenser;
- a third condenser connected in between the first and bypass condensers and in parallel with both the first and bypass condensers;
- a current detector on the DC link of the motor driving apparatus in series between the third condenser and the bypass condenser; and
- a filter having a LC serial resonance circuit connected in parallel with the current detector,
- wherein the LC serial resonance circuit is configured to have its resonance frequency matched to a frequency of ringing generated based upon wiring from the bypass condenser to power devices, wiring from the power devices to the motor, and within the motor.

8. A phase current detection apparatus that detects a phase current of a motor based upon a current of a DC link and a vector pattern applied to the motor, the motor being provided in a motor driving apparatus which supplies outputs from a PWM inverter to the motor to drive the motor, comprising:
- a bypass condenser connected to an input side of the PWM inverter, the bypass condenser being in parallel with a first condenser of the motor driving apparatus, the bypass condenser also being further downstream from a rectifier of the motor driving apparatus relative to the first condenser;
- a third condenser connected in between the first and bypass condensers and in parallel with both the first and bypass condensers;
- a current detector on the DC link of the motor driving apparatus in series between the third condenser and the bypass condenser; and
- a determination device for measuring at least one of a rising delay time, a descending delay time, and a waveform of a current corresponding to a command for the inverter, and for determining at least one of a current detection timing and a minimum voltage vector length based upon the measurement result.

9. The phase current detection apparatus as set forth in claim 8, wherein the determination device measures at least one of the rising delay time, the descending delay time, and the waveform of the current corresponding to a command for the inverter and flowing in the DC link under a condition in which DC current is flowing into the motor.

10. The phase current detection apparatus as set forth in claim 8,
- wherein the motor driving apparatus is configured to carry out PWM wave generation using a triangle wave comparison method such that two voltage vectors from the inverter in synch with each other are output within one carrier that allows two related current wave forms to be observed, and
- wherein the determination device carries out measurement of at least one of the rising delay time, the descending delay time, and the waveform of the current corresponding to a command for the inverter and measurement of the current for phase current detection, at a rising slope and descending slope of the triangle wave, respectively.

11. The phase current detection apparatus as set forth in claim 8, wherein the determination device reduces the current measurement for the phase current detection, and carries out measurement of at least one of the rising delay time, the descending delay time, and the waveform of a current corresponding to a command for the inverter.

12. The phase current detection apparatus as set forth in claim 11, wherein the motor drives an enclosed compressor.

13. A phase current detection apparatus that detects a phase current of a motor based upon a current of a DC link and a vector pattern applied to the motor, the motor being provided in a motor driving apparatus which supplies outputs from a PWM inverter to the motor to drive the motor, comprising:
- a bypass condenser connected to an input side of the PWM inverter, the bypass condenser being in parallel with a first condenser of the motor driving apparatus, the bypass condenser also being further downstream from a rectifier of the motor driving apparatus relative to the first condenser;
- a third condenser connected in between the first and bypass condensers and in parallel with both the first and bypass condensers; and
- a current detector on the DC link of the motor driving apparatus in series between the third condenser and the bypass condenser; and
- a first filter in parallel with the current detector, the filter provided for offsetting an error due to an inductance component accompanying a shunt resistor of the current detector.

14. The phase current detection apparatus as set forth in claim 13, wherein the first filter has a pole at a lower frequency than an upper limit of frequency characteristics required for the current detection circuit.

15. The phase current detection apparatus as set forth in claim 13, wherein the first filter involves a pole at a frequency generated by the shunt resistor and inductance component accompanying the shunt resistor.

16. The phase current detection apparatus as set forth in claim 13, further comprising a second filter which cancels an oscillation component of the current flowing in the shunt resistor.

17. The phase current detection apparatus as set forth in claim 16, wherein the first or second filter comprises passive elements and is connected directly to the shunt resistor.

18. A phase current detection apparatus that detects a phase current of a motor based upon a current of a DC link and a vector pattern applied to the motor, the motor being provided in a motor driving apparatus which supplies outputs from a PWM inverter to the motor to drive the motor, comprising:
- a bypass condenser connected to an input side of the PWM inverter, the bypass condenser being in parallel with a first condenser of the motor driving apparatus, the bypass condenser also being further downstream from a rectifier of the motor driving apparatus relative to the first condenser;
- a third condenser connected in between the first and bypass condensers and in parallel with both the first and bypass condensers; and a current detector on the DC link of the motor driving apparatus in series between the third condenser and the bypass condenser; and a noise canceling device provided to cancel noise due to magnetic flux generated from a shunt resistor of the current detector and the DC link.

19. A phase current detection apparatus that detects a phase current of a motor based upon a current of a DC link and a vector pattern applied to the motor, the motor being provided in a motor driving apparatus which supplies outputs from a PWM inverter to the motor to drive the motor, comprising:

a bypass condenser connected to an input side of the PWM inverter, the bypass condenser being in parallel with a first condenser of the motor driving apparatus, the bypass condenser also being further downstream from a rectifier of the motor driving apparatus relative to the first condenser;

a third condenser connected in between the first and bypass condensers and in parallel with both the first and bypass condensers; and a current detector on the DC link of the motor driving apparatus in series between the third condenser and the bypass condenser, wherein circuitry elements of the current detector implemented so that the circuitry elements are not affected by noise due to magnetic flux generated from a shunt resistor of the current detector and the DC link.

20. The phase current detection apparatus as set forth in claim 19, wherein the circuitry elements are implemented in parallel to a plane which is generated by magnetic flux generated from the shunt resistor and the DC link.

21. A motor driving apparatus, comprising:

a rectifier configured to convert an AC input power to a DC power and output the DC power via output terminals;

an inverter whose input terminals are connected to the output terminals of the rectifier, the inverter configured to receive the DC power from the rectifier and output a three-phase power;

first, second, and third condensers all connected in parallel between the output terminals of the rectifier, wherein the first condenser is electrically closest to the rectifier, the second condenser is electrically closest to the inverter, and the third condenser is electrically in between the first and second condensers; and a current detector serially placed in a DC link of the motor driving apparatus between the second and third condensers, wherein capacitances of the second and third condensers are set such that a resonance current is substantially equal to or less than a minimum detectable current, wherein the resonance current is current due to inductance of wirings between the first and third condensers, motor phase currents, and the second and third condensers.

22. A motor driving apparatus, comprising:

a rectifier configured to convert an AC input power to a DC power and output the DC power via output terminals;

an inverter whose input terminals are connected to the output terminals of the rectifier, the inverter configured to receive the DC power from the rectifier and output a three-phase power;

first, second, and third condensers all connected in parallel between the output terminals of the rectifier, wherein the first condenser is electrically closest to the rectifier, the second condenser is electrically closest to the inverter, and the third condenser is electrically in between the first and second condensers; and a current detector serially placed in a DC link of the motor driving apparatus between the second and third condensers, wherein the current detector comprises a filter and a shunt resistor connected in parallel, wherein a frequency characteristic of the filter is set to match a cutoff frequency of the motor driving apparatus.

23. The apparatus of claim 22, wherein the filter of the current detector comprises:

a capacitor with a first terminal connected to a ground and a second terminal connected to an output of the filter; and a resistor with a first terminal connected to an input of the filter and a second terminal connected to the output of the filter, wherein a capacitance of the capacitor is C and a resistance of the resistor is R, and wherein a value RC is set such that a resonance frequency of the filter is substantially equal to or greater than a ringing frequency of the motor driving apparatus.

24. The apparatus of claim 22, wherein the current detector further comprises a current outputting section whose output serves as the output of the current detector, the current outputting section comprising:

an operational amplifier with a non-inversion input connected to the output of the filter and an output connected to the output of the current outputting section;

a first resistor with a first terminal connected to a ground and a second terminal connected to an inversion input of the operational amplifier;

a second resistor with a first terminal connected to the inversion input of the operational amplifier and a second terminal connected to the output of the operational amplifier; and a capacitor with a first terminal connected to the inversion input of the operational amplifier and a second terminal connected to the output of the operational amplifier.

25. The apparatus of claim 22, further comprising an LC serial resonance circuit connected in parallel with the shunt resistor of the current detector.

26. The apparatus of claim 22, wherein a resonance frequency of the LC serial resonance circuit is substantially matched to a ringing frequency generated by wirings of the motor driving apparatus.

27. The apparatus of claim 26, wherein the wirings of the motor driving apparatus include wirings from the third condenser to power devices, from the power devices to a motor, and within the motor.

28. The apparatus of claim 22, wherein the filter of the current detector comprises a resistor and a capacitor connected in series, wherein a resistance Rc of the resistor and a capacitance Cc of the capacitor are set such that CcRc is substantially equal to Ls/Rs, wherein Rs is a resistance of the shunt resistor and Ls is a parasitic capacitance of the shunt resistor.

29. The apparatus of claim 22, wherein the current detector further comprises an amplifier circuit connected in parallel with the shunt resistor, wherein the amplifier circuit is oriented in parallel with a flux generated by current in the shunt resistor.

* * * * *